(12) United States Patent
Hu et al.

(10) Patent No.: US 11,107,823 B2
(45) Date of Patent: *Aug. 31, 2021

(54) INTEGRATED STRUCTURES AND METHODS OF FORMING INTEGRATED STRUCTURES

(71) Applicant: Micron Technology, Inc., Boise, ID (US)

(72) Inventors: Yongjun Jeff Hu, Boise, ID (US); Allen McTeer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/684,515

(22) Filed: Nov. 14, 2019

(65) Prior Publication Data
US 2020/0083238 A1 Mar. 12, 2020

Related U.S. Application Data

(60) Continuation of application No. 16/406,504, filed on May 8, 2019, now Pat. No. 10,504,911, which is a (Continued)

(51) Int. Cl.
*H01L 27/11524* (2017.01)
*H01L 21/02* (2006.01)
(Continued)

(52) U.S. Cl.
CPC .. *H01L 27/11524* (2013.01); *H01L 21/02672* (2013.01); *H01L 21/3221* (2013.01); *H01L 27/1157* (2013.01); *H01L 27/11582* (2013.01)

(58) Field of Classification Search
CPC ......... H01L 27/11524; H01L 27/11582; H01L 27/1157; H01L 21/3221
See application file for complete search history.

(56) References Cited

U.S. PATENT DOCUMENTS 9,780,103 B2 * 10/2017 Hu .................... H01L 27/11524
10,325,917 B2 * 6/2019 Hu .................... H01L 27/11524
(Continued)

OTHER PUBLICATIONS

Choi et al., "Kinetics of Ni-Mediated Crystallization of a-Si Through a SiNx Cap Layer, Journal of the Electrochemical Society," 151(7), 2004, pp. G448-G451.
(Continued)

*Primary Examiner* — Joseph C. Nicely
(74) *Attorney, Agent, or Firm* — Wells St. John P.S.

(57) ABSTRACT

Some embodiments include an integrated structure having semiconductor material within a region between two parallel surfaces. The semiconductor material has grain boundaries parallel to the parallel surfaces. At least one circuit component utilizes a region of the semiconductor material in a gated device. The semiconductor material has little if any metal therein so that the gated device has Ion/Ioff characteristics similar to if the semiconductor material had no metal therein. Some embodiments include a method in which semiconductor material is provided between a pair of parallel surfaces, and in which the parallel surfaces and semiconductor material extend between a first end and a second end. Metal is formed adjacent the first end, and gettering material is formed adjacent the second end. Thermal processing induces crystallization of the semiconductor material and drives the metal along the semiconductor material and into the gettering material. The gettering material is then removed.

24 Claims, 22 Drawing Sheets

Related U.S. Application Data division of application No. 15/686,107, filed on Aug. 24, 2017, now Pat. No. 10,325,917, which is a division of application No. 14/942,823, filed on Nov. 16, 2015, now Pat. No. 9,780,103.

(51) Int. Cl.
*H01L 21/322* (2006.01)
*H01L 27/1157* (2017.01)
*H01L 27/11582* (2017.01)

(56) References Cited

U.S. PATENT DOCUMENTS

| | | | |
|---|---|---|---|
| 10,504,911 B2* | 12/2019 | Hu | H01L 21/02672 |
| 10,734,491 B2* | 8/2020 | Brewer | H01L 29/66833 |
| 2013/0003433 A1 | 1/2013 | Hishida | |
| 2013/0048985 A1 | 2/2013 | Hu | |
| 2015/0380422 A1 | 12/2015 | Sharangpani | |
| 2016/0163686 A1 | 6/2016 | Lee | |
| 2016/0268274 A1 | 9/2016 | Kawai | |
| 2016/0322632 A1 | 11/2016 | Strunk | |
| 2016/0329453 A1 | 11/2016 | Chaudhari | |
| 2017/0323899 A1 | 11/2017 | Park | |

OTHER PUBLICATIONS

Hayzelden et al., "Silicide formation and silicide-mediated crystallization of nickel-implanted amorphous silicon thin films," Journal of Applied Physics, 73(12), 1993, pp. 8279-8289.

Joshi et al., "High Performance Submicrometer CMOS with Metal Induced Lateral Crystallization of Amorphous Silicon," Journal of the Electrochemical Society, 2003, 150(8), pp. G443-G449.

Minagawa et al., "Fabrication of <111>-Oriented Si Film with a Ni/Ti Layer by Metal Induced Crystallization," Japanese Journal of Applied Physics, 40, 2001, pp. L186-L188.

* cited by examiner

INTEGRATED STRUCTURES AND METHODS OF FORMING INTEGRATED STRUCTURES

RELATED PATENT DATA

This application is the result of a continuation of, and claims priority to, U.S. patent application Ser. No. 16/406,504, filed May 8, 2019, which is a divisional of and claims priority to, U.S. patent application Ser. No. 15/686,107, filed Aug. 24, 2017, now U.S. Pat. No. 10,325,917, which is a divisional of and claims priority to, U.S. patent application Ser. No. 14/942,823, filed Nov. 16, 2015, now U.S. Pat. No. 9,780,103, the disclosures of which are incorporated herein by reference.

TECHNICAL FIELD

Integrated structures and methods of forming integrated structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A conventional NAND configuration 500 is shown in FIG. 1 in cross-sectional side view and schematic view. The NAND configuration 500 corresponds to pipe-shaped bit cost scalable (P-BiCS) flash memory. The NAND string is U-shaped and extends between a source line and a bitline. The NAND memory includes control gates 512 which are spaced from a channel region 514 by gate dielectric 516.

The channel material 514 comprises semiconductor material; and may, for example, comprise polycrystalline silicon. There may be advantages to utilizing channel materials having specific crystalline textures, but difficulties are encountered in reproducibly forming desired crystalline textures within the U-shaped channel material 514. It would be desirable to develop architectures having desired crystalline textures within U-shaped NAND channel material, and to develop methods of forming such architectures.

The NAND configuration 500 is one of many configurations in which it would be useful to tailor crystalline texture within a semiconductor material. It would also be desirable for the new methods to be applicable for other configurations in addition to the U-shaped NAND configuration 500.

DETAILED DESCRIPTION OF THE ILLUSTRATED EMBODIMENTS

Some embodiments include methods of utilizing metal to induce a desired texture within semiconductor material. The semiconductor material may be configured to have two exposed ends, and to be between a pair of parallel surfaces. The ends may be referred to as a first end and a second end. The metal may be provided adjacent the first end, and then thermal processing may be utilized to induce crystallization of the semiconductor material utilizing the metal. The metal may travel from the first end to the second end during the thermal processing. A pair of gettering regions may be provided over the second end, with a first of the gettering regions being adjacent the second end and a second of the gettering regions being more distal from the second end. Thermodynamics may drive the metal through the first gettering region and into the second gettering regions. Subsequently, the gettering regions may be removed.

Specific example embodiments are described below with reference to FIGS. 2-22.

Figure 1:
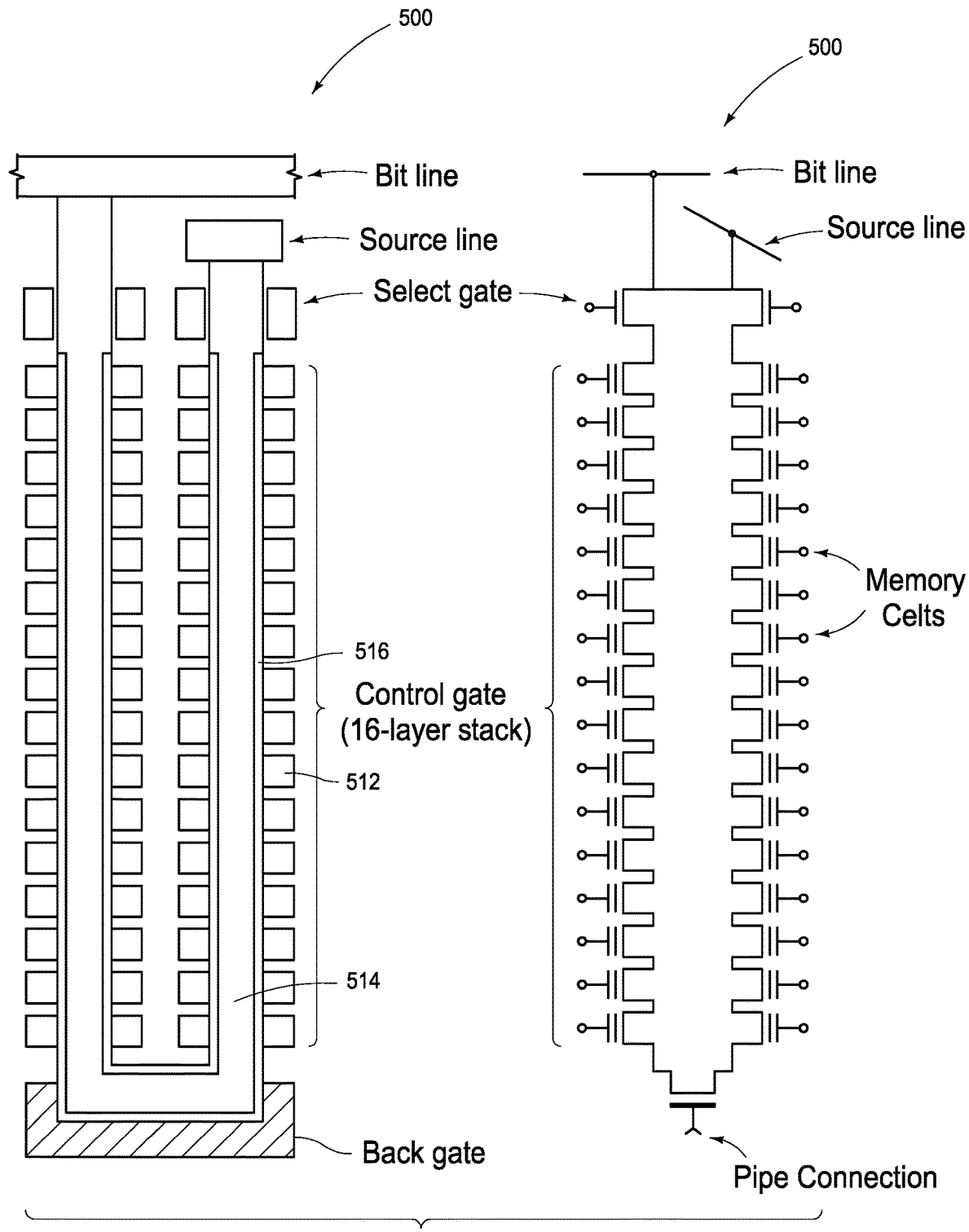
FIG. 1 shows a prior art pipe-shaped bit cost scalable (P-BiCS) flash memory configuration in cross-sectional side view and schematic view.
Figure 2:
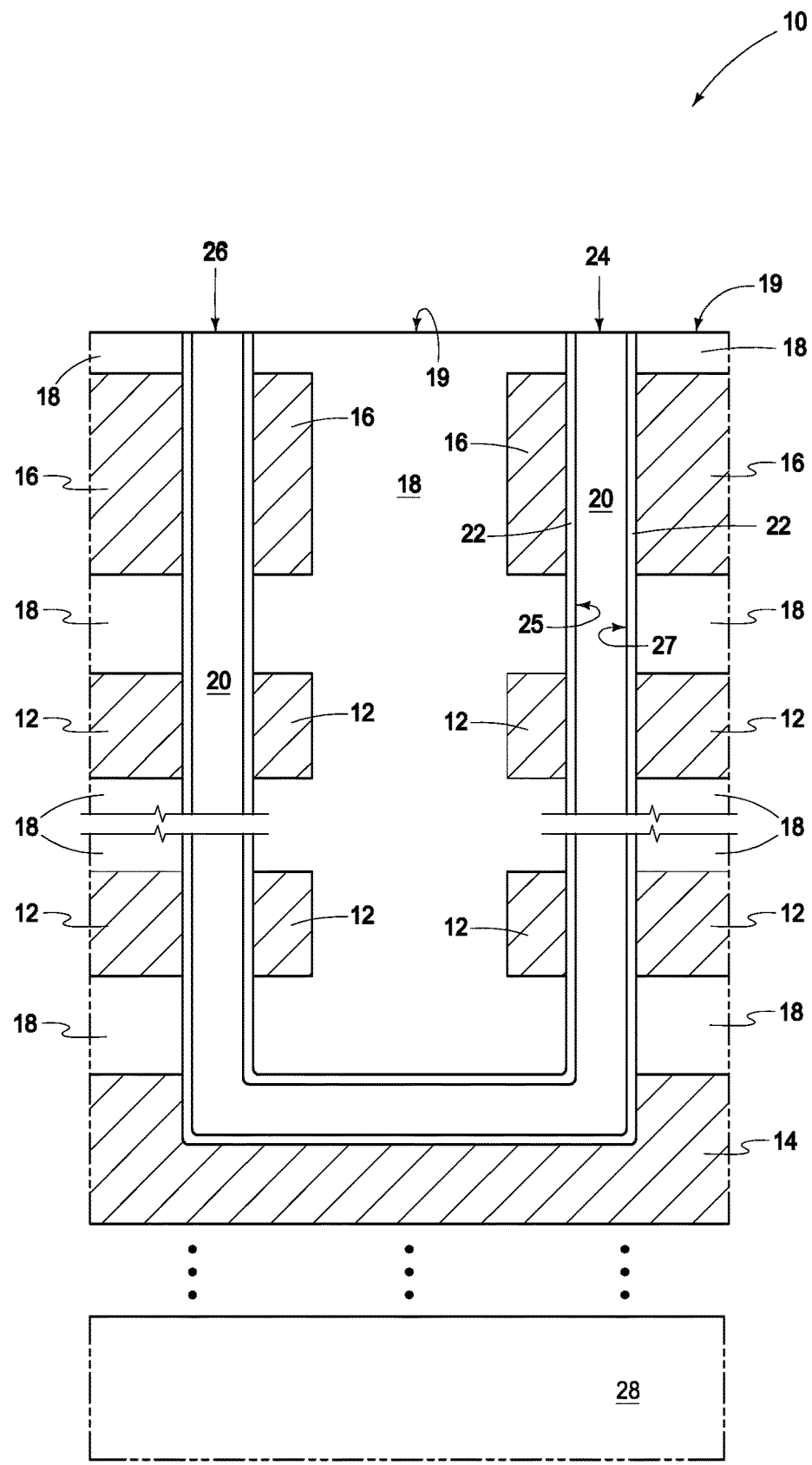
FIGS. 2-10 show a construction in diagrammatic cross-sectional side view at process stages of an example embodiment method of forming an example embodiment U-shaped NAND configuration.

Referring to FIG. 2, an example NAND configuration 10 is illustrated. The configuration comprises control gates 12, a back gate 14 and a select gate 16; analogous to structures described above with reference to the conventional NAND configuration of FIG. 1.

The gates 12, 14 and 16 are spaced from one another by one or more dielectric materials 18. Such dielectric material(s) may comprise, for example, silicon dioxide, silicon nitride, etc.

The gates 12, 14 and 16 may comprise any suitable electrically conductive composition or compositions. In some embodiments the gates 12, 14 and 16 be the same composition as one another; and in other embodiments at least one of such gates may differ in composition relative to at least one other of the gates.

A break is provided between a pair of the control gates 12 to indicate that the configuration may have more than the illustrated number of control gates. The NAND configuration includes a string of memory cells (a so-called NAND string), with the number of memory cells in the string being determined by the number of control gates 12. The NAND string may comprise any suitable number of control gates. For instance, the NAND string may have 8 control gates, 16 control gates, 32 control gates, 64 control gates, 512 control gates, 1024 control gates, etc.

The NAND configuration 10 comprises semiconductor channel material 20 adjacent control gates 12, back gate 14 and select gate 16. The semiconductor channel material may comprise any suitable composition; and in some embodiments may comprise, consist essentially of, or consist of one or both of silicon and germanium.

The semiconductor channel material is spaced from conductive material of the gates 12, 14 and 16 by gate dielectric 22. The gate dielectric may comprise any suitable composition or combination of compositions; and in some embodiments may comprise, consist essentially of, or consist of silicon dioxide.

The channel material 20 is in a U-shaped configuration, and is part of a U-shaped NAND string. The term "U-shaped" is used to refer to structures loosely analogous to a "U"; which may include, but is not limited to, structures which strictly resemble a "U".

The U-shaped channel material extends between a first end 24 along one side of the U-shape and a second end 26 along another side of the U-shape. The semiconductor channel material has a first crystallographic texture. In some embodiments, such first crystallographic texture may be substantially non-ordered; and, for example, may be polycrystalline and/or amorphous.

The gate dielectric 22 has interior surfaces 25 and 27 on opposing sides of channel material 20. The interior surfaces 25 and 27 may be considered to be parallel to one another (at least to within reasonable tolerances of fabrication and measurement), and in the shown configuration are U-shaped.

The back gate 14 shown to be supported over a base 28. The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

The base 28 is spaced from back gate 14 by a gap. Such gap is utilized to indicate that there may be additional materials between base 28 and the back gate 14.

The construction 10 has an upper surface 19 at the processing stage of FIG. 2; with such upper surface extending across the ends 24 and 26 of channel material 20, and across the uppermost portion of dielectric material(s) 18.

Figure 3:
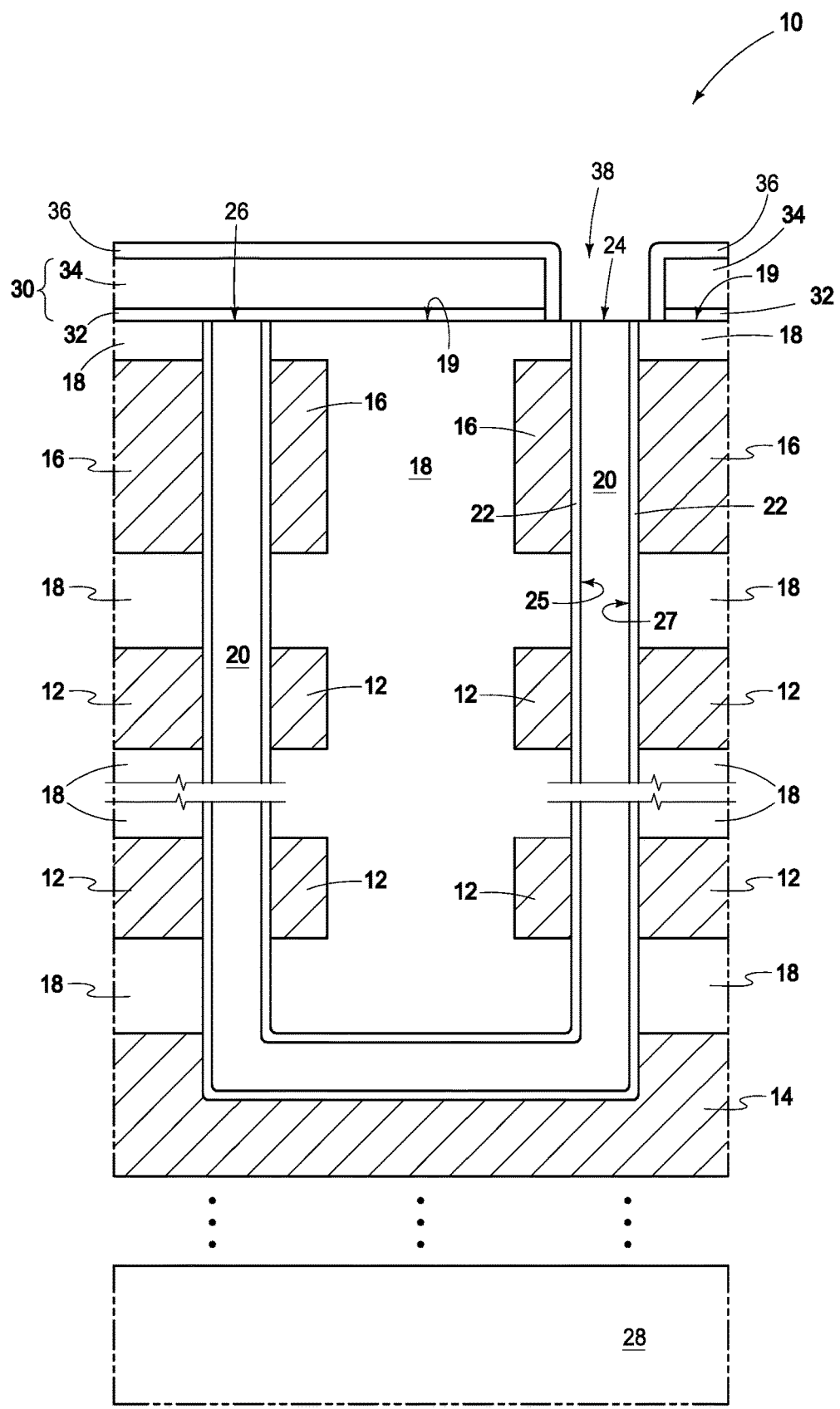

Referring to FIG. 3, gettering material 30 is formed over the second end 26 of the U-shaped channel material 20, while leaving the first end 24 of the U-shaped channel material exposed.

The gettering material 30 includes a first region 32 and a second region 34. In the illustrated embodiment the regions 32 and 34 are two distinct layers. In other embodiments, the regions may be comprised by a gradient as discussed in more detail below. Also, although the shown gettering material comprises two distinct layers, in other embodiments the gettering material may comprise three or more layers, may comprise one or more layers in combination with a gradient, etc. In other words, the gettering material 30 may comprise more than the illustrated two regions 32 and 34 in some embodiments.

In the illustrated embodiment, the first region 32 of the gettering material may comprise tungsten silicide and/or tantalum silicide, and may be formed to a thickness within a range of from about 100 Å to about 200 Å. The second region 34 may comprise silicon (for instance, amorphous silicon), and may be formed to a thickness greater than or equal to about 200 Å (for instance, a thickness within a range of from about 0.2 nanometers to about 10 nanometers). In operation, the composition of region 32 is chosen so that thermodynamics favor migration of a metal from the channel material 20 into the first region 32; and the composition of region 34 is chosen so that thermodynamics favor migration of the metal from the first region 32 into the second region 34. Accordingly, metal from semiconductor material 20 may be effectively trapped within the region 34 which is displaced from the upper surface of the semiconductor material by the intervening region 32. Subsequently, the regions 32 and 34 may be removed to effectively remove the metal from the semiconductor material 20. The example compositions of regions 32 and 34 may be utilized to favor the thermodynamic drive of metal from channel material 20 into the upper region 34. In other embodiments, other compositions of regions 32 and 34 may be utilized to achieve the same thermodynamic drive. In some embodiments, both of regions 32 and 34 may be amorphous as deposited. Region 32 may have a higher amorphous-to-crystal (a-to-c) transition temperature as compared to channel material 20 and region 34. Accordingly, region 32 may remain amorphous while region 34 crystallizes through metal-induced crystallization. Such may be a basis of thermodynamic drive of metal from channel material 20 into upper region 34 of gettering material 30. If gettering material 30 comprises additional regions (for instance, a third region, a fourth region, etc.), such additional regions may be between regions 32 and 34 and may have amorphous-to-crystal transition temperatures lower than region 32 and higher than region 34 to assist in transferring metal toward region 34.

The gettering material 30 may be formed in the desired configuration which covers first end 24 while leaving second end 26 exposed with any suitable processing. For instance, the gettering material may be formed to extend across both ends 24 and 26, and may be subsequently patterned to remove the gettering material from over the first end 24.

In some embodiments, the regions 32 and 34 may correspond to portions of a gradient extending through material 30, rather than to specific layers. For instance, in some embodiments gettering material 30 may correspond to a structure having a first stoichiometry in the first gettering region 32 and a second stoichiometry in the second gettering region, and having a gradient from the first gettering region to the second gettering region. The first stoichiometry may transition to the second stoichiometry along said gradient. In a specific embodiment, the first stoichiometry may include $M_aSi_x$ and the second stoichiometry may include $M_bSi_y$, wherein the ratio of a/x is greater than the ratio of b/y, and wherein M is a transition metal. In some example embodiments M may be tungsten and/or titanium. In some example embodiments the composition at the upper region of the gettering material gradient may consist essentially of, or consist of silicon, and accordingly the ratio of b/y may be zero or at least may approach zero for the composition $M_bSi_y$ at the upper region (i.e., b may be zero or may approach zero at the upper region of the gradient).

A protective liner 36 is formed over gettering material 30. The protective liner prevents, or at least substantially impedes, migration of metal from a subsequently-formed metal layer (discussed below with reference to FIG. 4) into the gettering material 30. The liner 36 may comprise any suitable composition or combination of compositions; and in some embodiments may comprise, consist essentially of, or consist of silicon nitride. The liner may be formed to any suitable thickness, and in some embodiments may be formed to a thickness within a range of from about 200 Å to about 300 Å. The protective liner may be referred to as metal-barrier material.

An opening 38 extends through the gettering material 30 and liner 36 to the first end 24.

Figure 4:
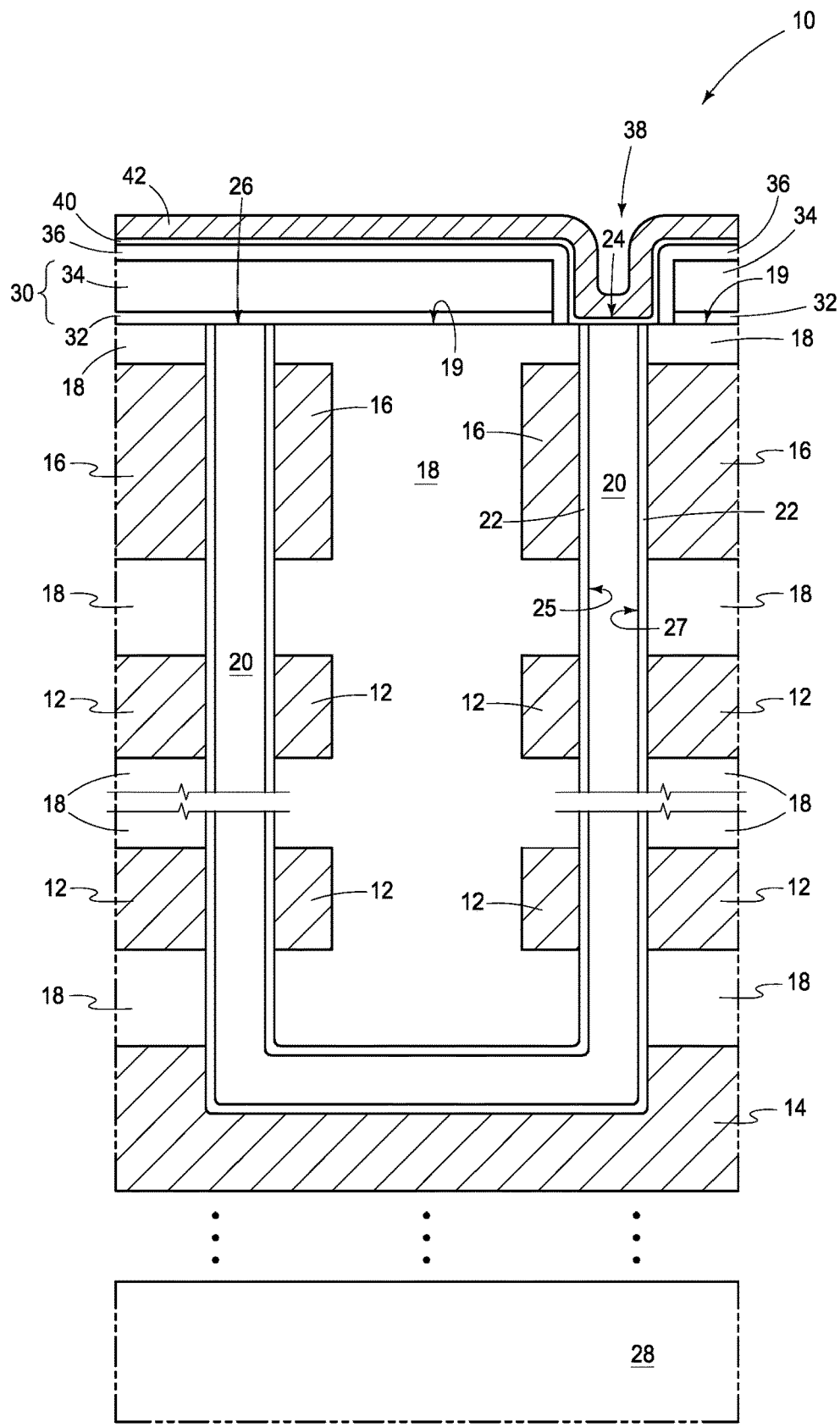

Referring to FIG. 4, an optional filter material 40 is formed over liner 36 and within the opening 38, and metal 42 is formed over the filter material and within the opening 38.

The metal 42 may comprise one or both of near-noble metal and noble metal; with near-noble metal being metals selected from group VIII of the periodic table (or groups 8, 9 and 10 under new notation), and noble metals being selected from group IB (or group 11 under new notation). Accordingly, near-noble metals include, for example, iron, cobalt, nickel, ruthenium, rhodium, palladium, etc.; and noble metals include copper, silver and gold. In some embodiments metal 42 may comprise aluminum.

The filter material 40 may comprise, for example, titanium and/or silicon nitride. For instance, in some embodiments the filter material may be a layer of titanium formed to a thickness of from about 10 Å to about 30 Å; and in some embodiments may be a layer of silicon nitride formed to a thickness of from about 50 Å to about 80 Å.

In some embodiments, metal 42 may comprise, consist essentially of, or consist of nickel; and may be a layer formed to a thickness of from about 0.5 Å to about 15 Å.

The metal 42 within opening 38 is adjacent the first end 24 of semiconductor channel material 20.

Figure 5:
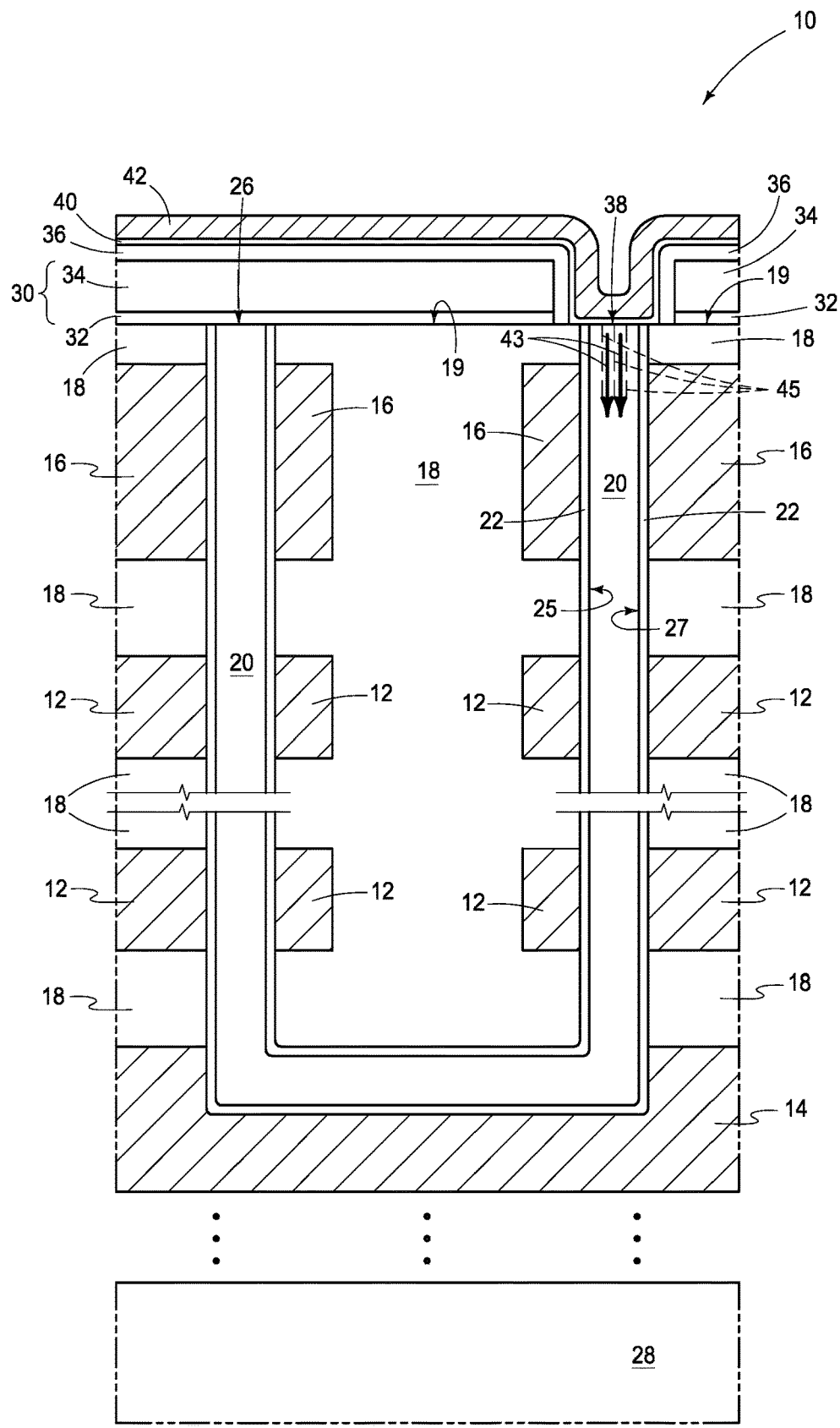

Referring to FIG. 5, thermal conditions are utilized to induce metal to migrate from material 42 into the first end 24 of the semiconductor channel material, as is diagrammatically illustrated utilizing arrows 43. The metal within semiconductor channel material 20 is utilized for metal-induced crystallization (MIC) and/or metal-induced lateral crystallization (MILC). Specifically, the metal induces crystallographic grain growth within the semiconductor material 20 as is diagrammatically illustrated utilizing dashed-lines 45. The metal-induced crystallization transitions a crystallographic texture within semiconductor channel material 20 from the first crystallographic texture to a second crystallographic texture having large crystalline grains and grain boundaries parallel to the parallel surfaces 25 and 27 of the gate dielectric material 22.

Any suitable thermal conditions may be utilized to transfer metal from the material 42 into the semiconductor channel material. The metal-induced crystallization of the semiconductor channel material is a thermodynamically-favored process. The metal migrates into the semiconductor channel material and then continues to move through the semiconductor channel material until the semiconductor channel material is entirely crystallized, provided that the thermal conditions are maintained for a suitable duration. In some embodiments the thermal processing may comprise a temperature within a range of from about 370° C. to about 550° C., for at least about 10 hours.

The filtering material 40 may moderate the amount of metal reaching the first end 24. A small amount of metal is sufficient to induce a desired crystallization, and too much metal may make it difficult to fully remove metal from the semiconductor channel material 20 in later processing. Additionally, too much metal may lead to smaller crystalline grains within the semiconductor channel material 20.

Figure 6:
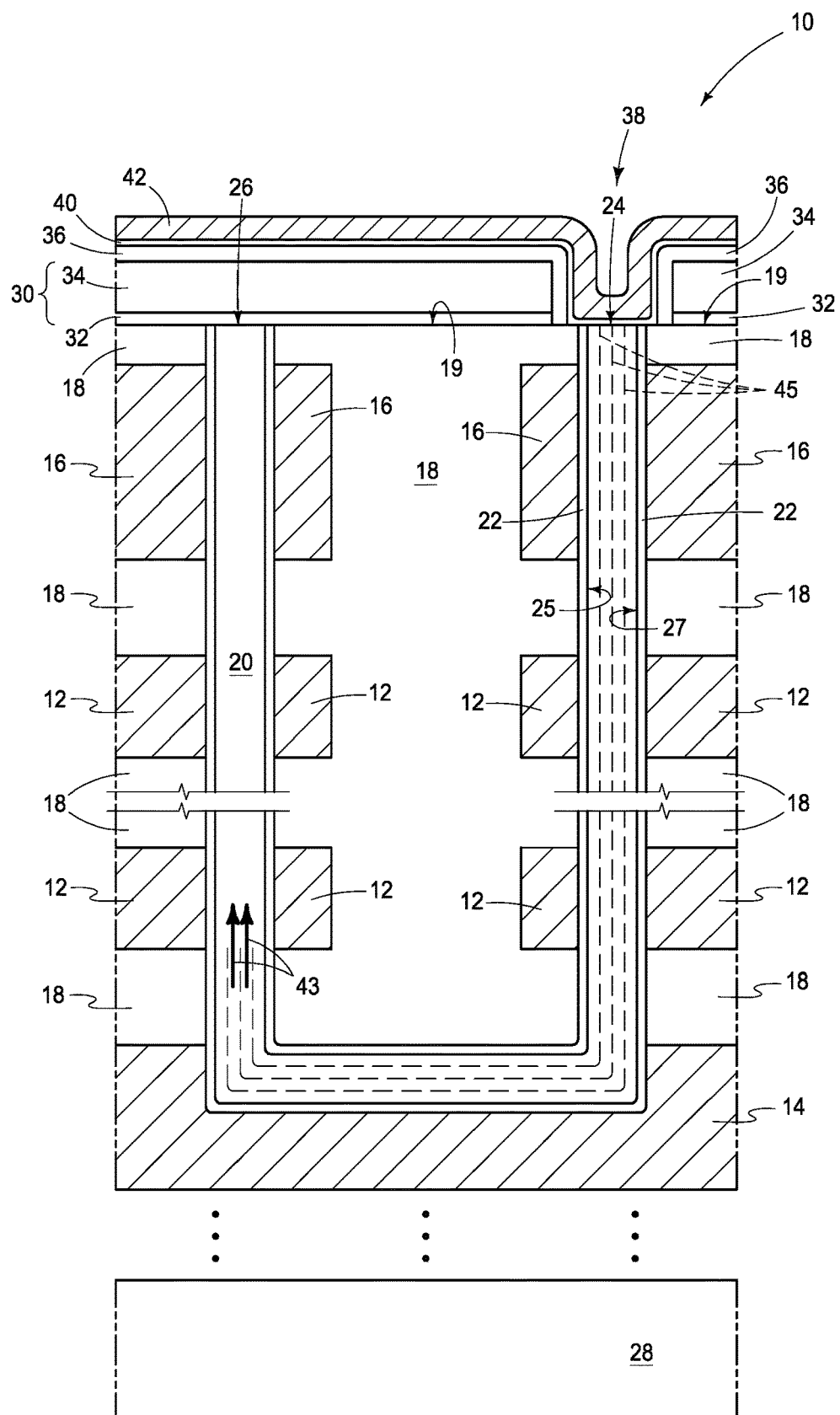
Figure 7:
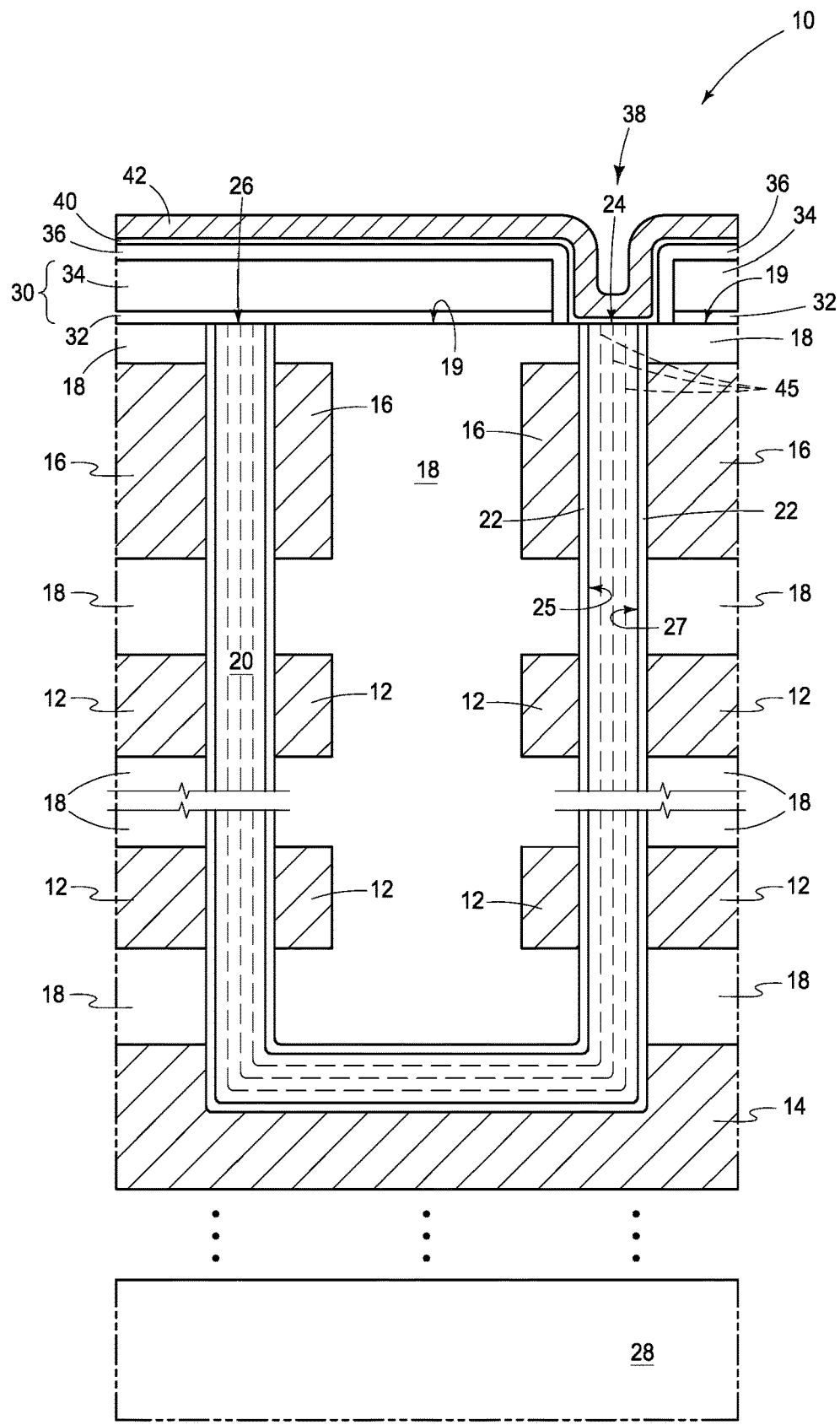

FIGS. 6 and 7 show the propagation of crystalline grains through the semiconductor channel material 20 during the metal-induced crystallization, and show the grains being aligned so that grain boundaries are parallel to the parallel surfaces 25 and 27 of the gate dielectric 22 (to within reasonable tolerances of fabrication and measurement). The metal utilized for inducing crystallization within channel material 20 may stay largely along a forward edge of the crystals propagating through channel material 20, and accordingly may accumulate adjacent the second end 26 of the U-shaped channel material 20 at the processing stage of FIG. 7.

Figure 8:
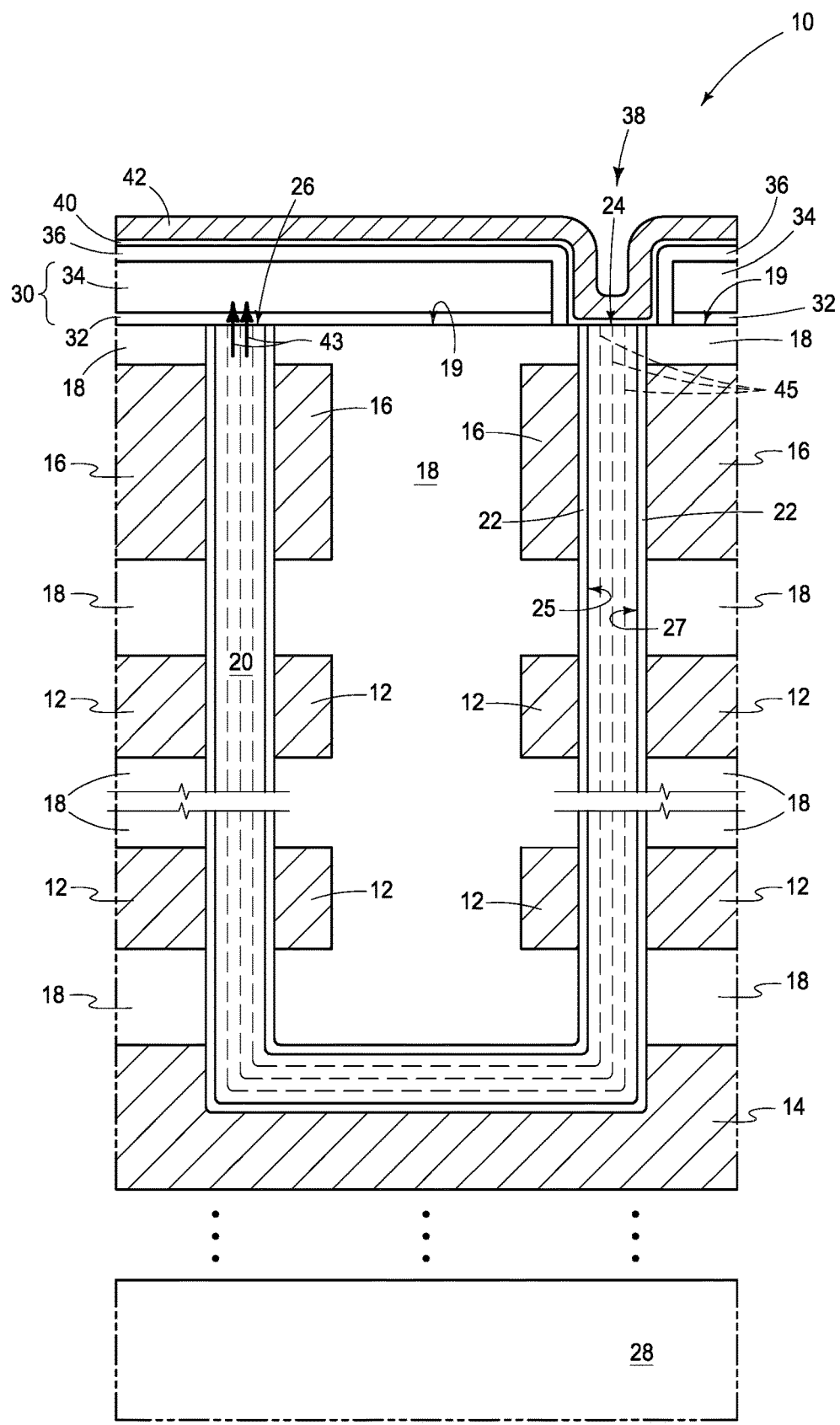
Figure 9:
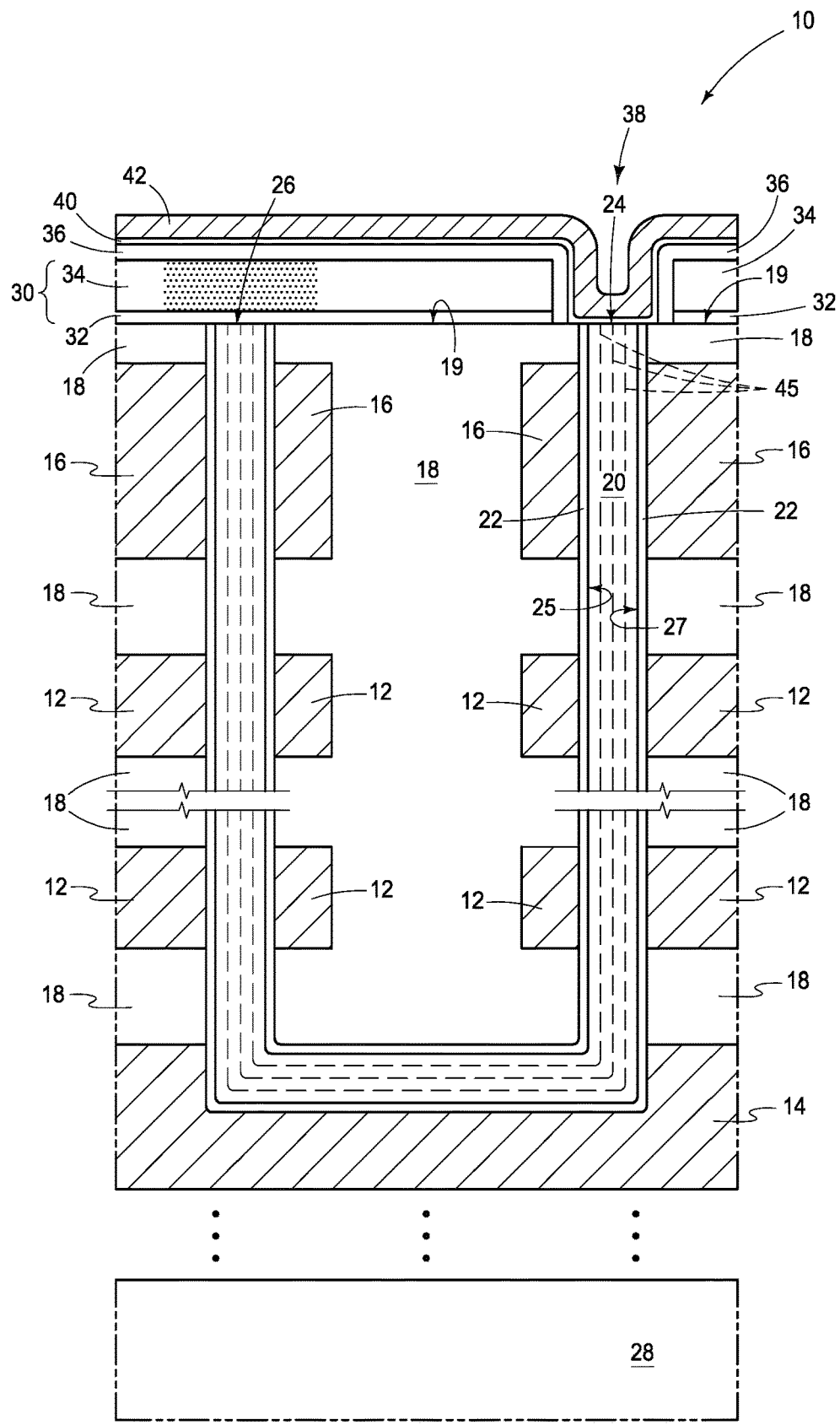

Referring to FIG. 8, the metal migrates from the semiconductor channel material 20 into the gettering material 30 at end 26, as is diagrammatically illustrated with arrows 43.

The metal migrates into the gettering material due to such being thermodynamically favored under the thermal conditions utilized for the metal-induced crystallization. As discussed above, the regions 32 and 34 of the gettering material are tailored so that thermodynamic forces cause the metal to be drawn into the lower region 32, and then to be transferred from the lower region 32 into the upper region 34. Accordingly, the metal eventually accumulates in the upper region 34 of gettering material 30 as is diagrammatically illustrated in FIG. 9 by stippling within the region 34 above the second end 26 of channel material 20. In some embodiments, both of regions 32 and 34 may be amorphous as deposited, and region 32 may have a higher amorphous-to-crystal transition temperature as compared to channel material 20 and region 34. Region 34 may be at least partially crystallized through metal-induced crystallization while region 32 remains amorphous, and after metal-induced crystallization of channel material 20. Such may be a basis of thermodynamic drive of metal from channel material 20 into upper region 34 of gettering material 30.

Figure 10:
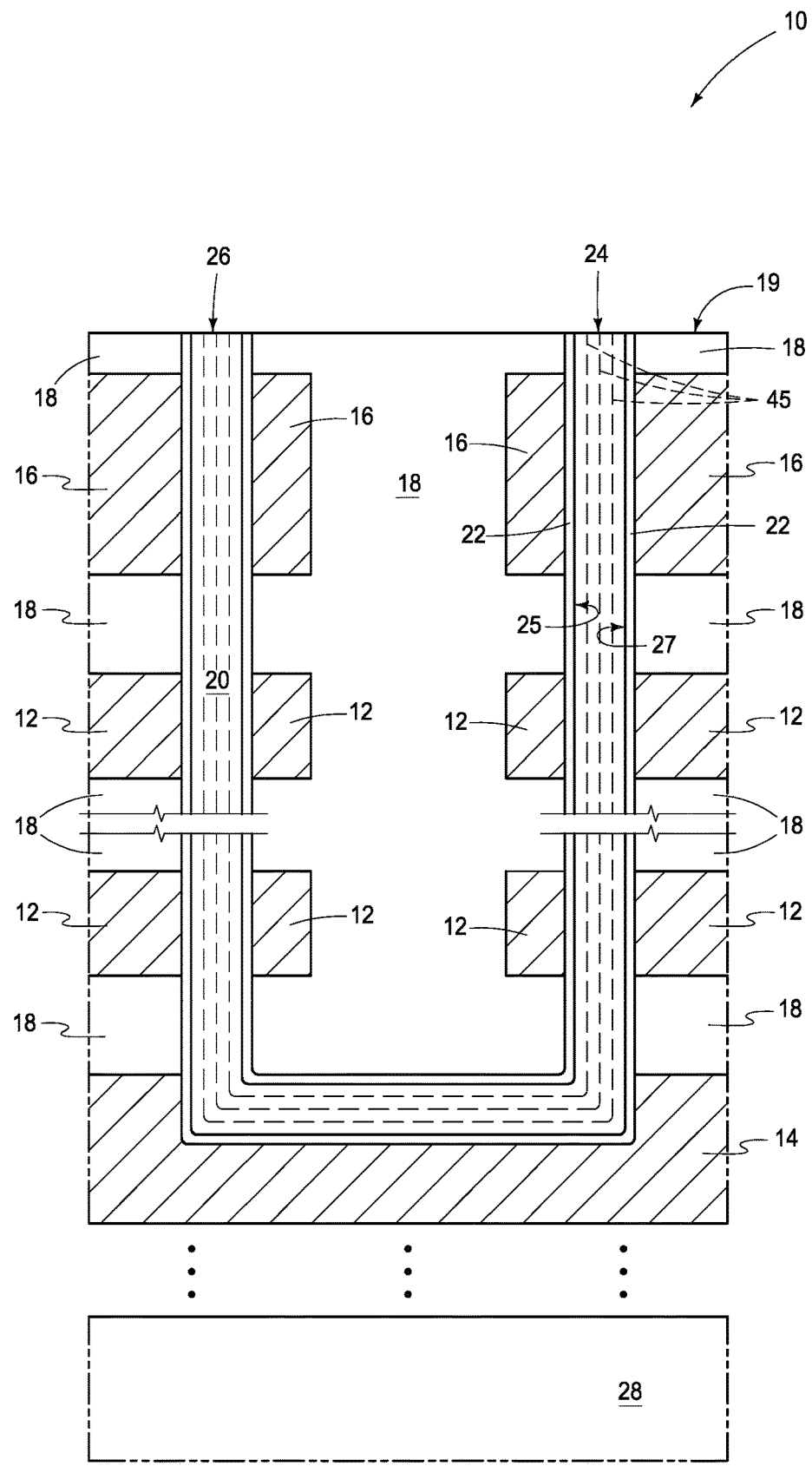

The accumulation of metal within the upper region of gettering material 30 may enable the metal to be effectively removed after it has served the purpose of inducing crystallization within channel material 20. FIG. 10 shows construction 10 after the gettering material 30, and all materials overlying material 30, have been stripped from over the upper surface 19.

The processing of FIGS. 2-10 may enable metal to be utilized for metal-induced crystallization of semiconductor channel material to form a crystallographic texture within the semiconductor material having grain boundaries 45 parallel to surfaces adjacent the channel material (for instance, the surfaces 25 and 27 of dielectric material 22). Further, the processing may enable all, or at least substantially all, of the metal to be removed from the channel material after serving the purpose of inducing crystallization. In some embodiments the construction of FIG. 10 may be considered to comprise circuit components (for instance, memory cells, select gates, etc.) which utilize the semiconductor channel material 20 in gated devices (with example gated devices being memory cells comprising control gates 12, and select gates comprising the gates 14 and 16). The quality of the gated devices may be quantitated in terms of Ion/Ioff characteristics of the devices. In some embodiments, metal removal from the semiconductor channel material will be sufficiently effective that the Ion/Ioff characteristics of the gated devices will be within a same order of magnitude as would occur if the semiconductor channel material 20 had no metal therein (i.e., within a factor of ten); within a factor of five as would occur if the semiconductor material had no metal therein, or even with a factor of two as would occur if the semiconductor material had no metal therein. For instance, in some applications Ion/Ioff characteristics of a transistor device (i.e., an example gated device) having pure silicon channel material (i.e., having no metal within the channel material) may be an Ion/Ioff ratio within a range of from about $10^7$ to about $10^{10}$.

The processing of FIGS. 2-10 may enable formation of constructions having semiconductor channel material that is entirely, or at least very close to entirely, metal-free (for instance, a metal concentration less than or equal to about 0.5 atomic percent); with such semiconductor channel material having grain boundaries 45 aligned relative to adjacent surfaces 25 and 27 of the gate dielectric 22.

The embodiment of FIGS. 3-10 has the gettering material 30 formed prior to providing the metal 42. In other embodiments, the metal may be utilized to induce crystallization within the semiconductor channel material, and subsequently the gettering material may be provided. An example of such other embodiments is described with reference to FIGS. 11-18.

Figure 11:
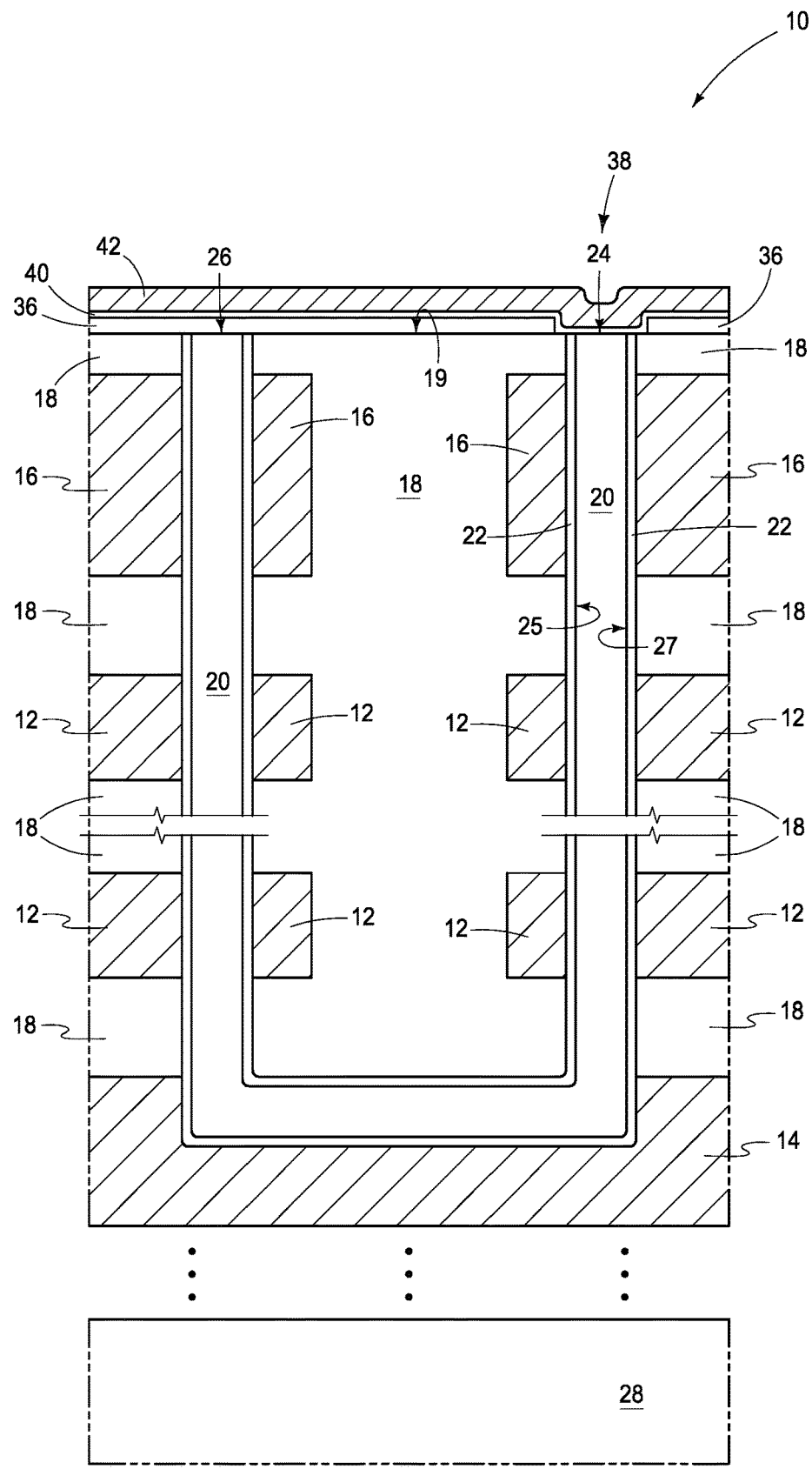
FIGS. 11-18 show a construction in diagrammatic cross-sectional side view at process stages of another example embodiment method of forming an example embodiment U-shaped NAND configuration. The process stage of FIG. 11 may follow that of FIG. 2.

Referring to FIG. 11, construction 10 is shown at a processing stage subsequent to that of FIG. 2. The protective liner (i.e., metal-barrier material) 36 is formed across upper surface 19 to cover the second end 26 of the semiconductor channel material 20 while leaving the first end 24 of the semiconductor channel material exposed within opening 38. The protective liner 36 of FIG. 11 may comprise the same composition and thickness as discussed above for the protective liner 36 of FIG. 3.

A filter material 40 and metal 42 are provided over protective liner 36 and extend into opening 38 so that the metal 42 is adjacent to the first end 24 of the semiconductor channel material 20. The filter material may comprise the compositions and thicknesses discussed above with reference to the filter material 40 of FIG. 4, and the metal may comprise the compositions and thicknesses discussed above relative to metal 42 of FIG. 4. In some embodiments, metal 42 of FIG. 11 may comprise nickel and/or aluminum, and semiconductor channel material 20 may comprise silicon.

Figure 12:
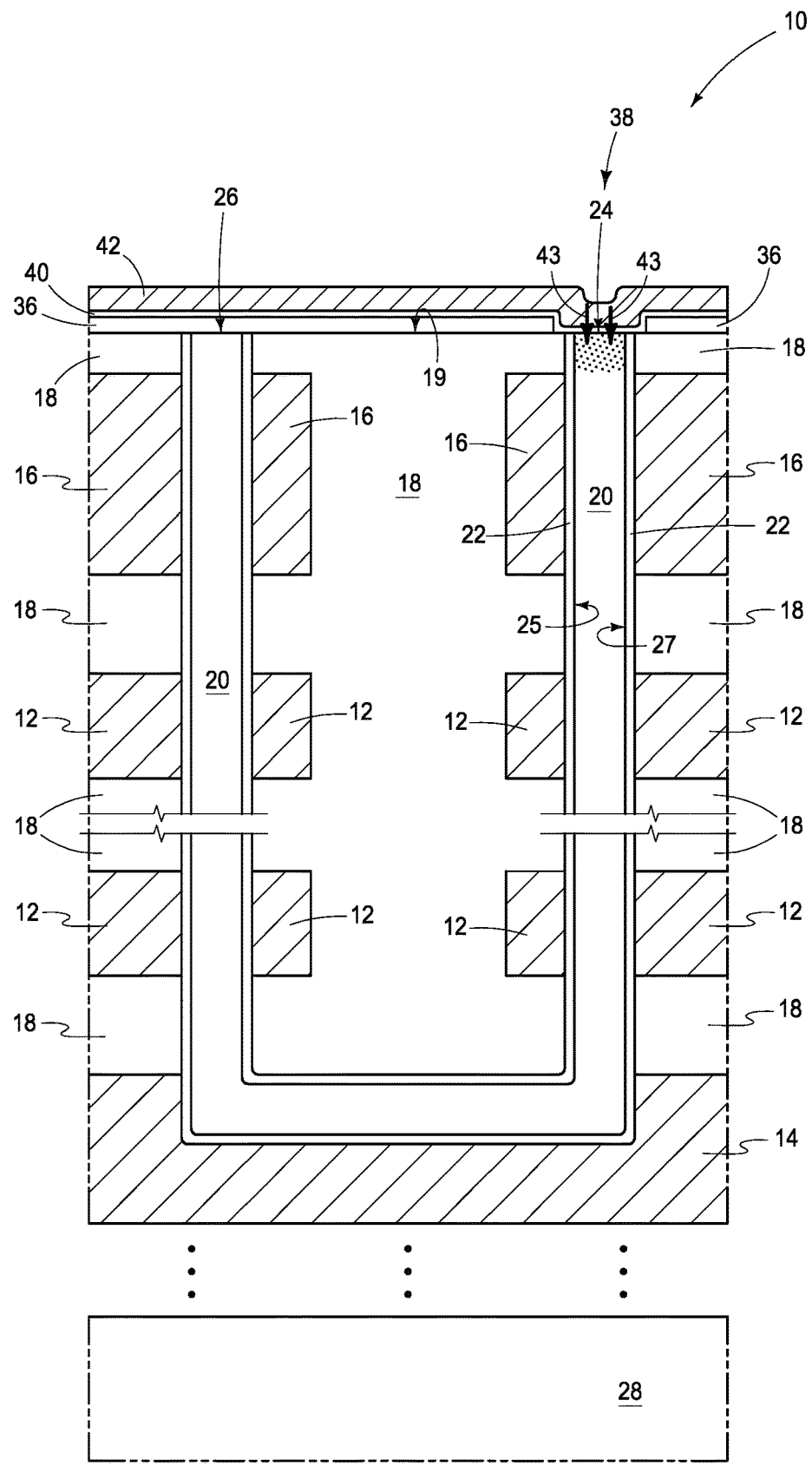

Referring to FIG. 12, a short thermal process (for instance, a rapid thermal process having a duration of from about 10 minutes about 20 minutes and a temperature within a range of from about 500° C. to about 600° C.) is utilized to diffuse metal 42 into semiconductor channel material 20 adjacent the first end 24, as is diagrammatically illustrated with arrows 43. The metal within semiconductor channel material 20 is diagrammatically illustrated with stippling.

Figure 13:
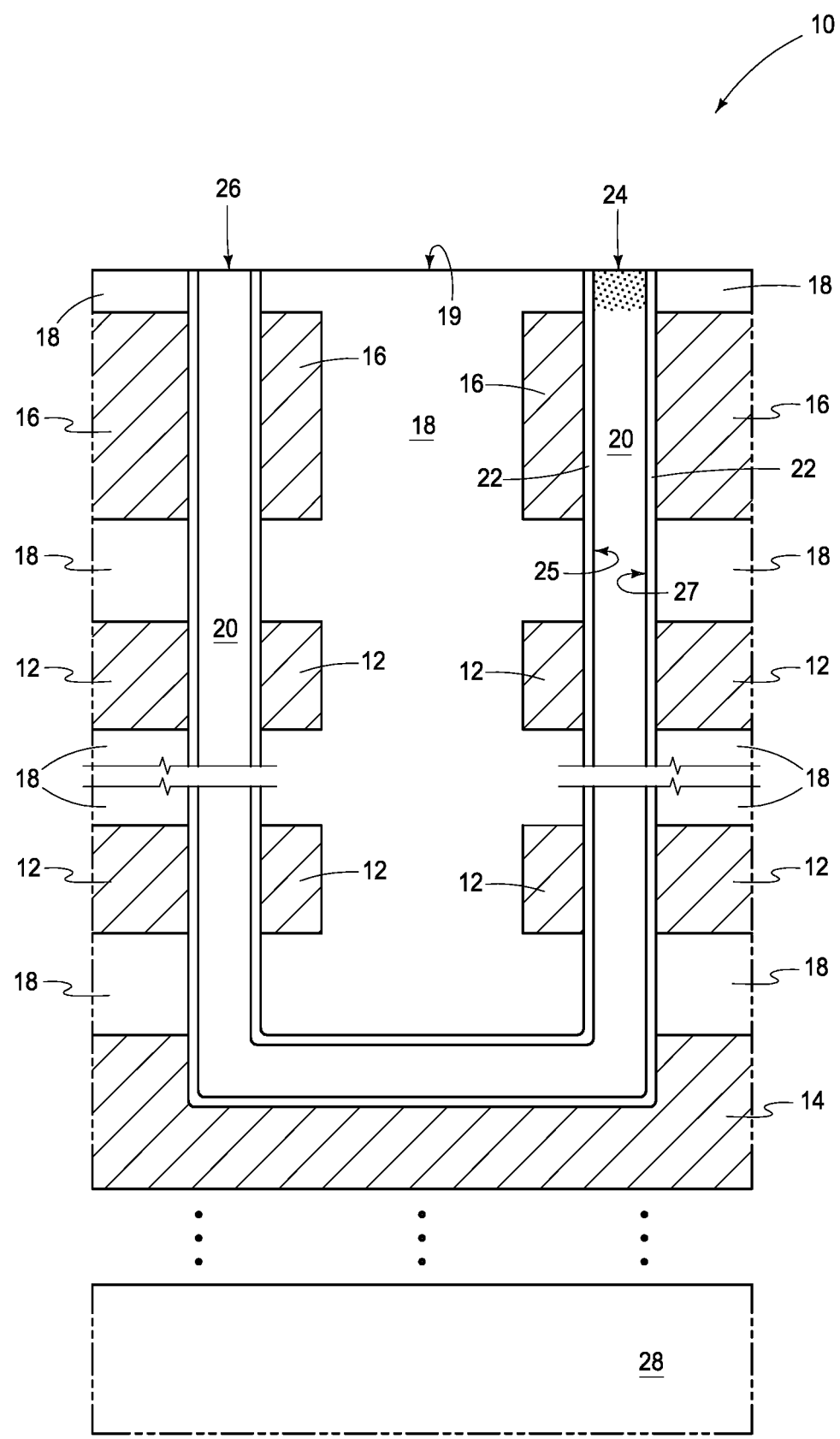

Referring to FIG. 13, the protective liner 36, filter material 40 and metal 42 are removed from over surface 19. The metal which had diffused into a shallow region of semiconductor channel material 20 adjacent the first end 24 remains, as is diagrammatically illustrated with stippling.

Figure 14:
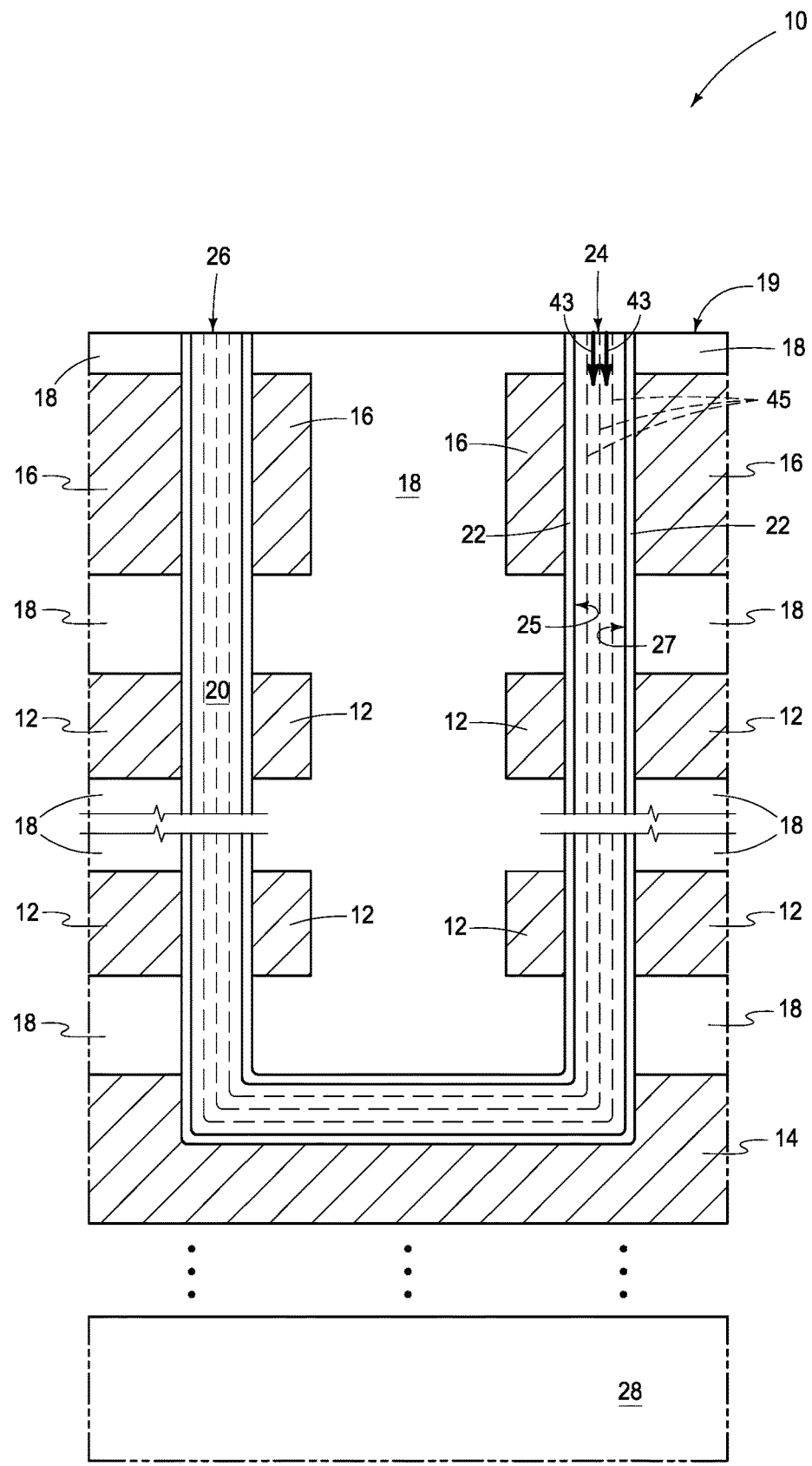

Referring to FIG. 14, thermal conditions are utilized to induce generate metal-induced crystallization (and/or metal-induced lateral crystallization) within the semiconductor material 20 as is diagrammatically illustrated utilizing arrows 43 to indicate migration of the metal, and dashed-lines 45 to indicate formation of grain boundaries parallel to the parallel surfaces 25 and 27 of the gate dielectric material 22. The metal-induced crystallization of semiconductor material 20 transitions the material 20 from a first texture to a second texture, analogously to the transition discussed above with reference to FIGS. 5-7.

Any suitable thermal processing may be utilized for the metal-induced crystallization. In some embodiments, the thermal processing may comprise a temperature within a range of from about 370° C. to about 550° C., for at least about 10 hours. In some embodiments, one or more cleaning steps (for instance, wet cleans) may be utilized to remove metal which may be on surface 19 adjacent one or both of the ends 24 and 26 after the metal-induced crystallization.

Figure 15:
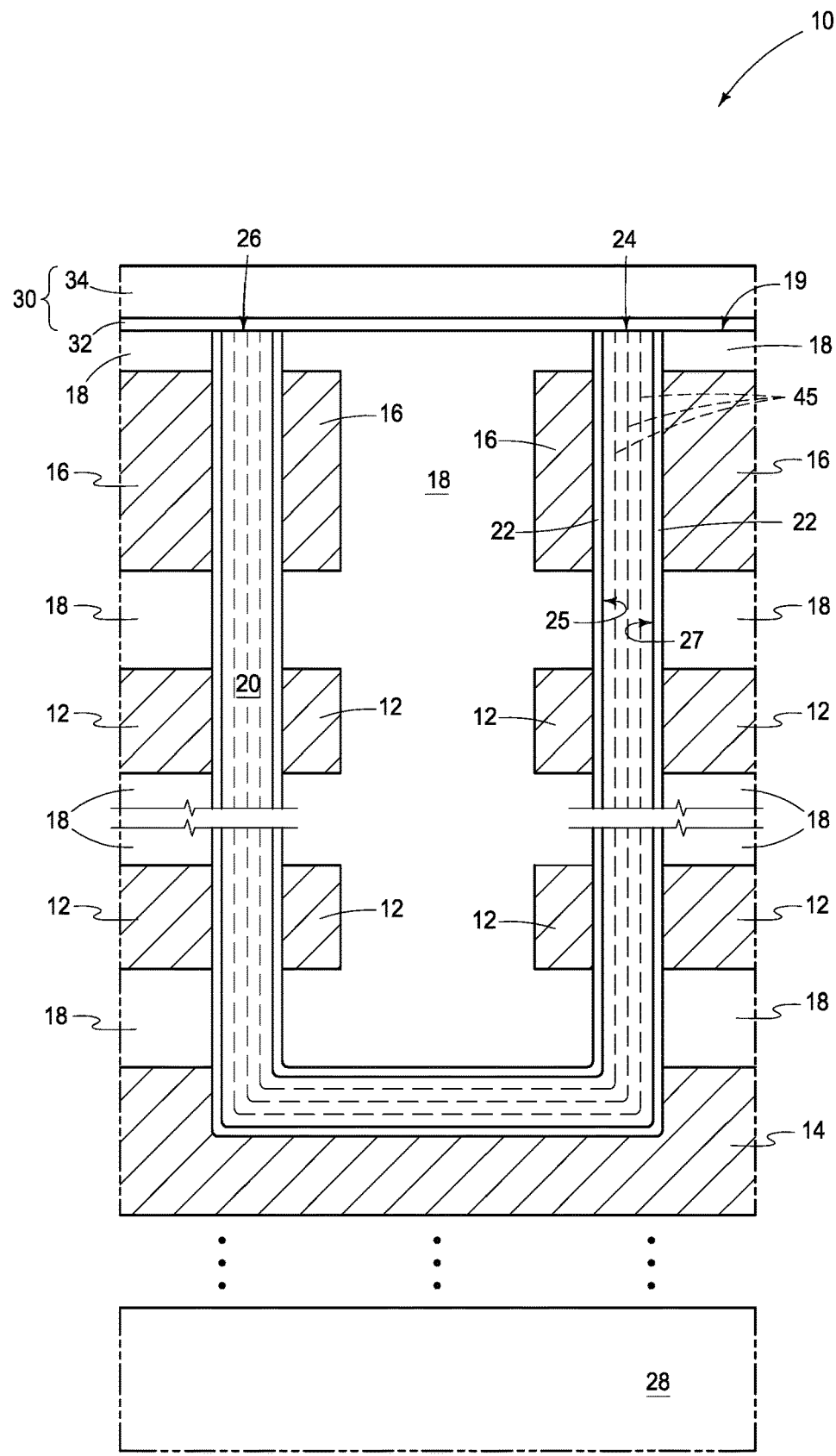

Referring to FIG. 15, the gettering material 30 is formed over the surface 19, and specifically across the first and second ends 24 and 26 of the U-shaped channel material 20. The illustrated gettering material 30 includes the first and second regions 32 and 34 discussed above with reference to FIG. 3; and may comprise any of the configurations described with reference to FIG. 3, such as, for example, separate discrete layers and/or a gradient.

Figure 16:
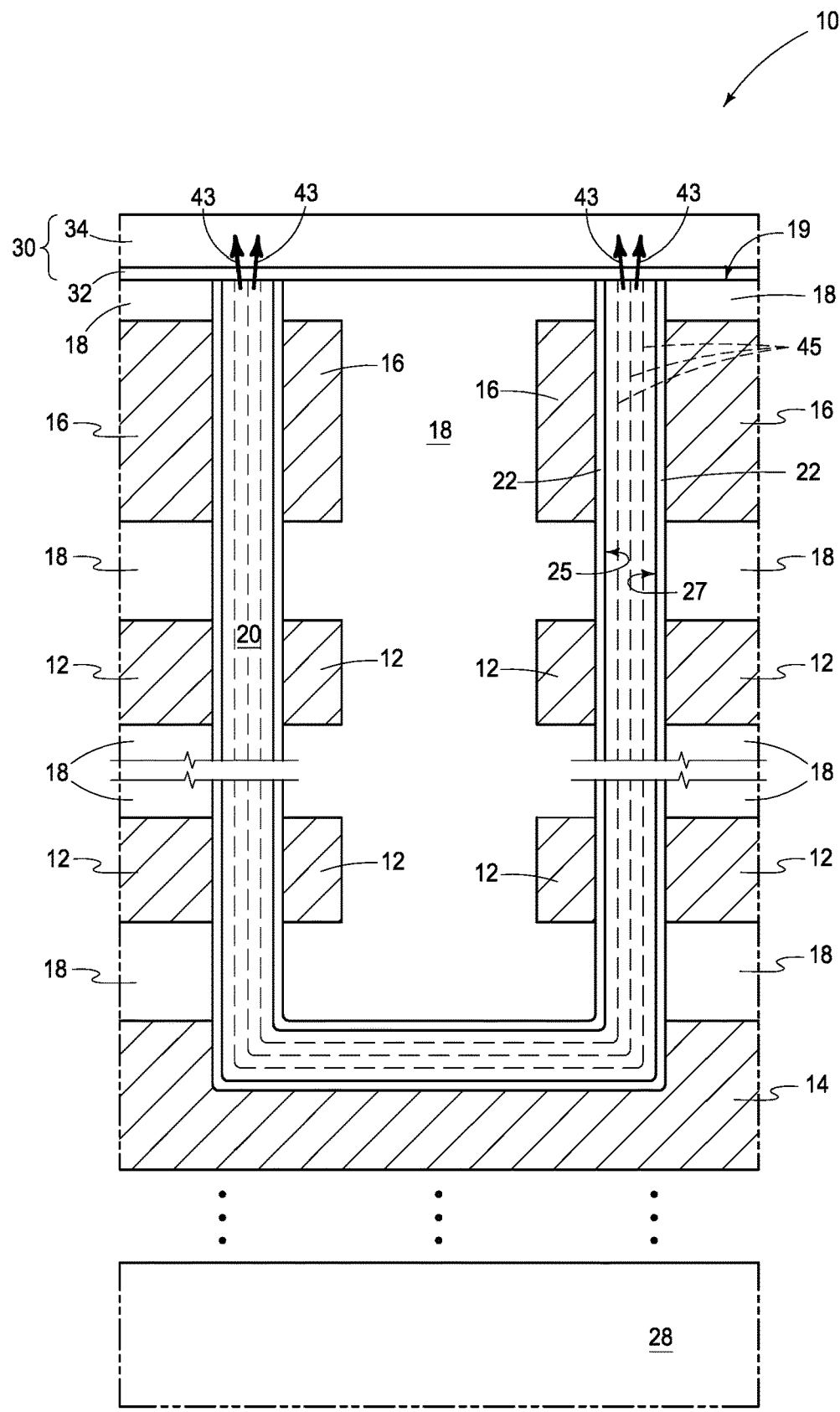
Figure 17:
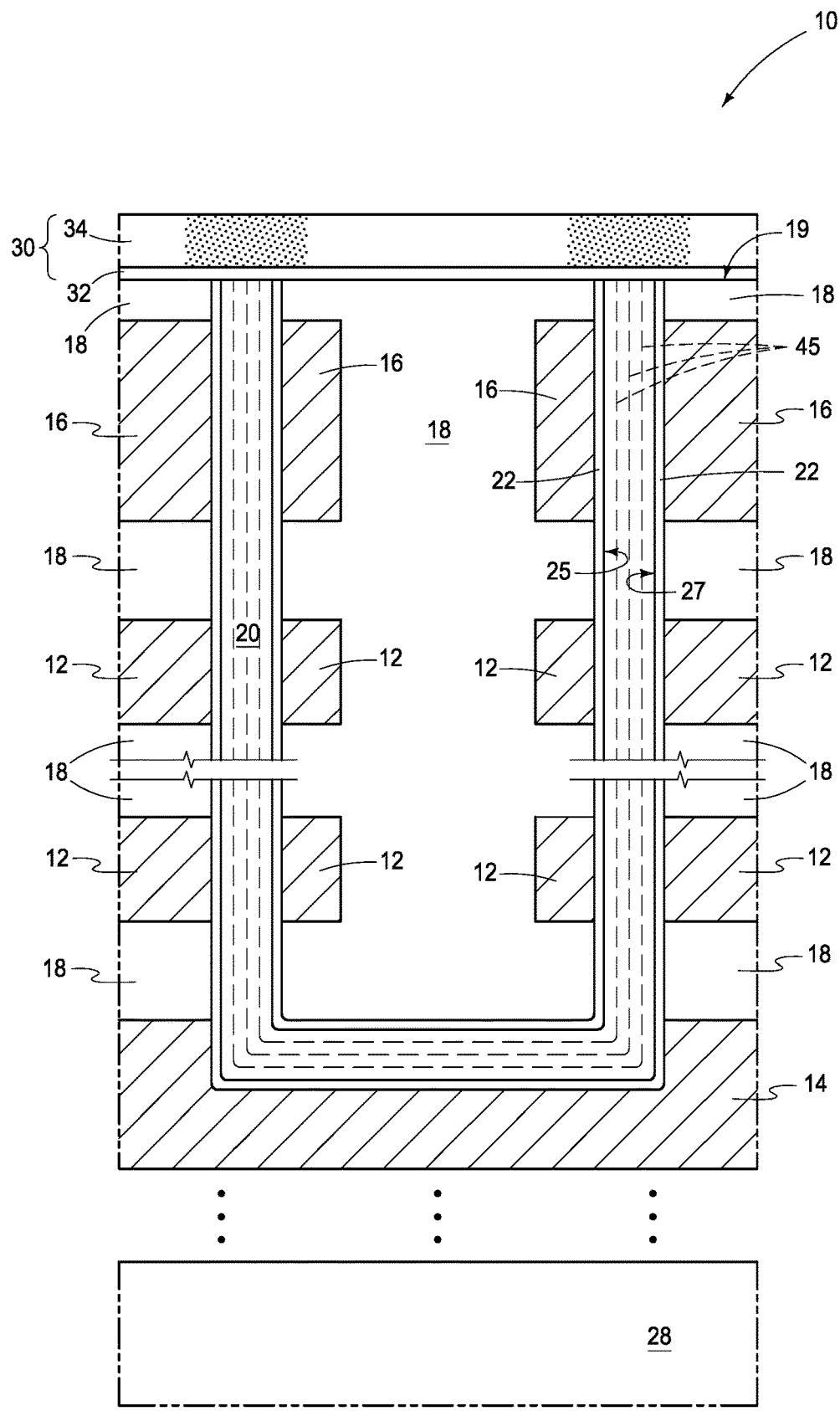

Referring to FIGS. 16 and 17, the metal migrates from the semiconductor material into the gettering material 30 and accumulates in the top region 34 of the gettering material. The metal migration is diagrammatically illustrated with arrows 43 in FIG. 16, and the metal accumulation within the top region 34 is diagrammatically illustrated in FIG. 17 by stippling. In the illustrated embodiment the metal accumulates above both of the ends 24 and 26 of the semiconductor channel material. In other embodiments, the metal may accumulate primarily over the end 26.

The metal migrates into the gettering material 30 due to such being thermodynamically favored. As discussed above, the regions 32 and 34 of the gettering material are tailored so that thermodynamic forces cause the metal to be drawn into the lower region 32, and then to be transferred from the lower region 32 into the upper region 34. In some embodiments, both of regions 32 and 34 may be amorphous as deposited, and region 32 may have a higher amorphous-to-crystal transition temperature as compared to channel material 20 and region 34. Region 34 may be at least partially crystallized through metal-induced crystallization while region 32 remains amorphous, and after metal-induced crystallization of channel material 20. Such may be a basis of thermodynamic drive of metal from channel material 20 into upper region 34 of gettering material 30.

Figure 18:
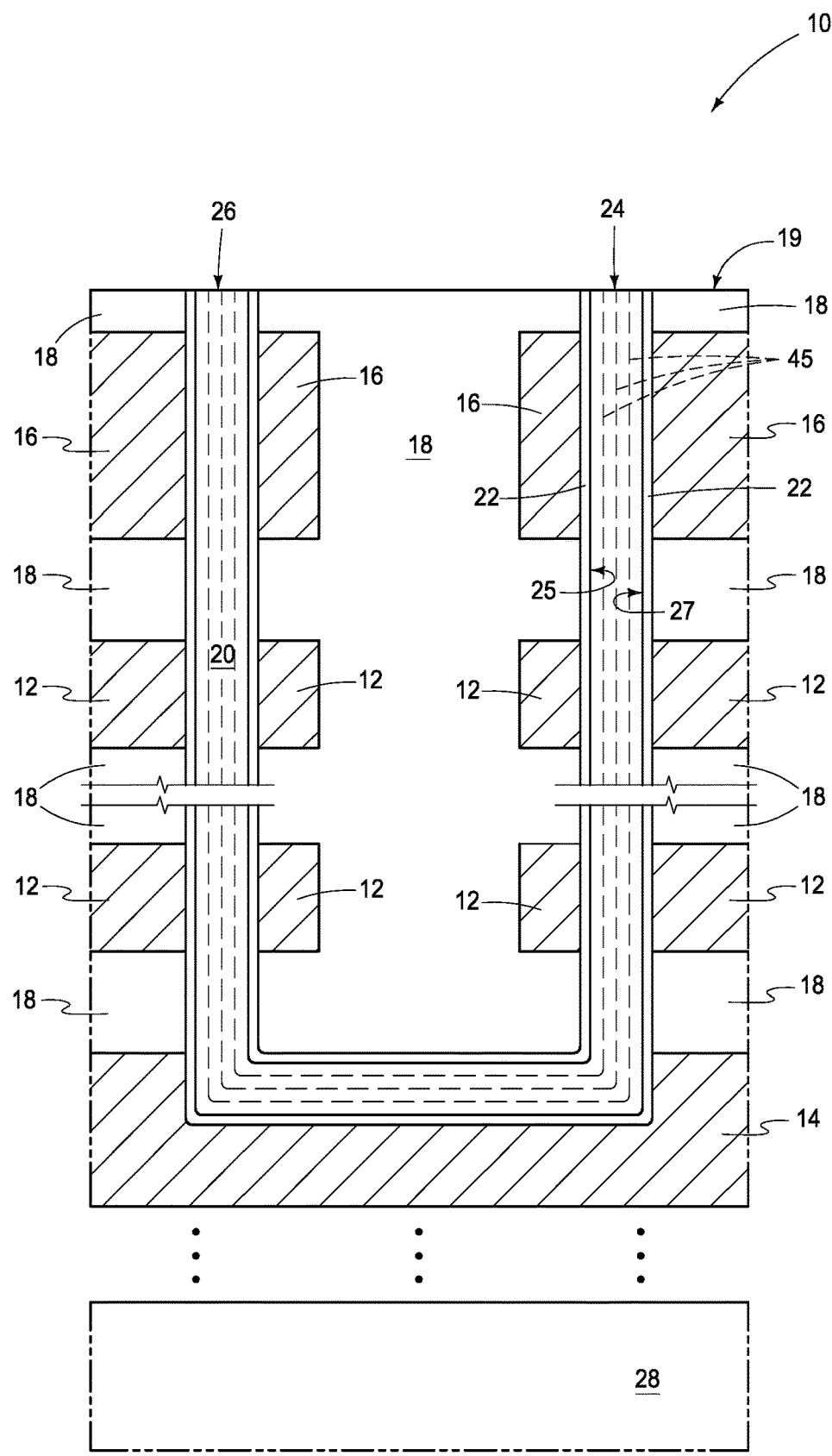

Referring to FIG. 18, the gettering material 30 (FIG. 17) is stripped from over the upper surface 19. The construction of FIG. 18 may be identical to that described above with reference to FIG. 10.

The processing of FIGS. 15-18 (i.e., forming gettering material, thermal processing to drive metal from the semiconductor channel material into the gettering material, removing the gettering material) may be repeated more than once if such is useful in reducing a metal concentration in the semiconductor channel material to below a desired threshold (for instance, less than or equal to about 0.5 atomic percent).

Figure 19:
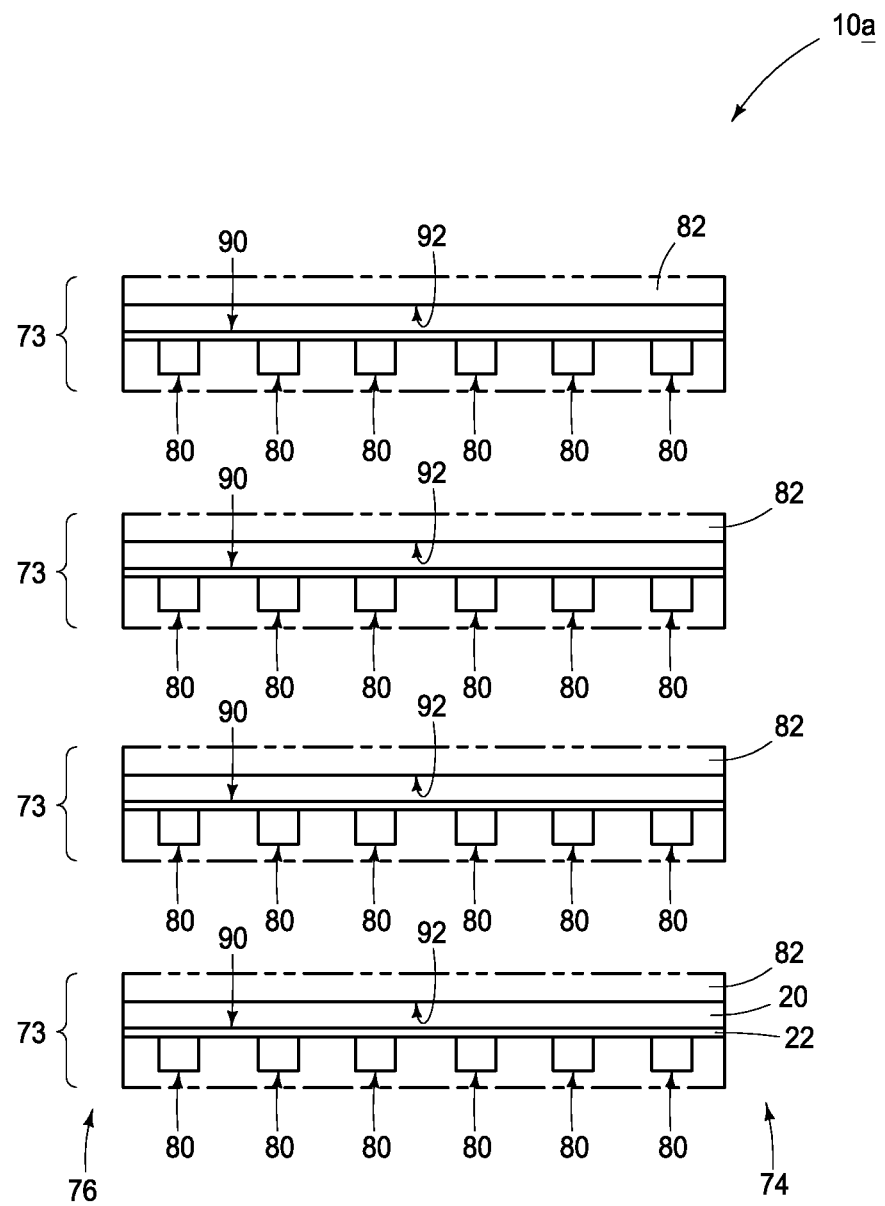
FIGS. 19-22 show a construction in diagrammatic cross-sectional side view at process stages of an example embodiment method of forming an example embodiment thin-film-transistor NAND configuration.

The embodiments of FIGS. 2-18 illustrate metal-induced crystallization within U-shaped semiconductor channel regions. An advantage of the U-shaped channel regions is that they have two ends which are readily accessible. Methodology described herein may be extended to other constructions in which semiconductor material has two ends which are readily accessible. For instance, FIG. 19 shows a construction 10a comprising a plurality of tiers 70-73 stacked one atop the other. Each tier has semiconductor channel material 20 extending from a first end 74 to a second end 76 (with the ends 74 and 76 corresponding to sides of construction 10a). The tiers are spaced from one another to indicate that there may be other materials or structures between the tiers. In some embodiments, the device layers of FIG. 19 may be flipped upside down relative to the shown configuration during device fabrication.

Each tier comprises a plurality of transistor gates 80, and comprises gate dielectric material 22 between the gates and the channel material 20. Additionally, each tier comprises insulative material 82 on an opposing side of the channel material from the gate dielectric 22.

The gate dielectric 22 has a surface 90, and the insulative material 82 has a surface 92; with the surfaces 90 and 92 being parallel to one another. The channel material 20 is between the parallel surfaces 90 and 92.

In some embodiments the gates 80, gate dielectric 22 and channel material 20 together form a plurality of thin-film-transistors. The construction 10a may thus correspond to thin-film-transistor NAND flash memory (i.e., TFT-NAND flash memory).

Figure 20:
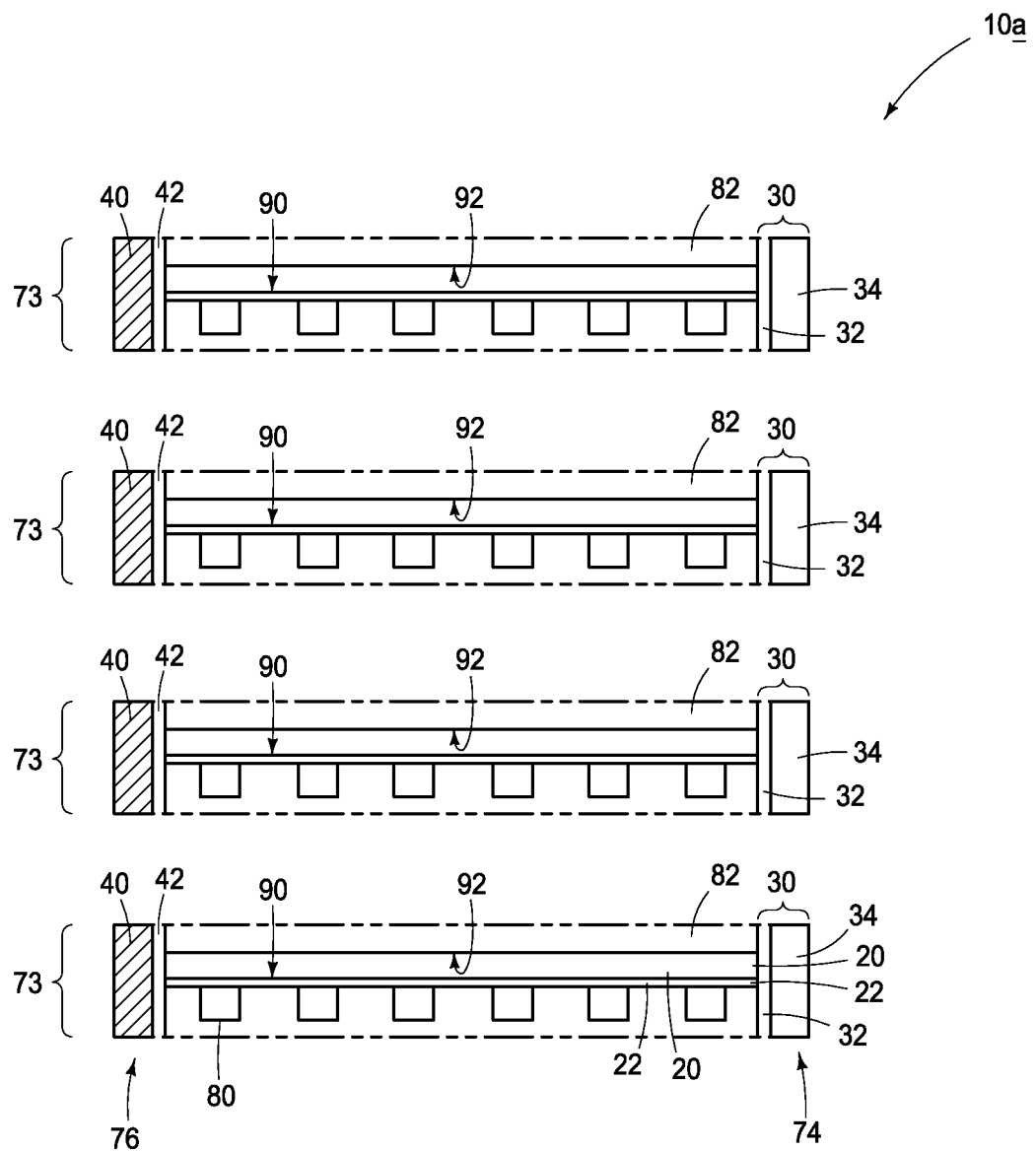

Referring to FIG. 20, gettering material 30 is formed along the side 74 of construction 10a, and the filter material 40 and metal 42 are formed along the opposing side 76 of the construction.

Figure 21:
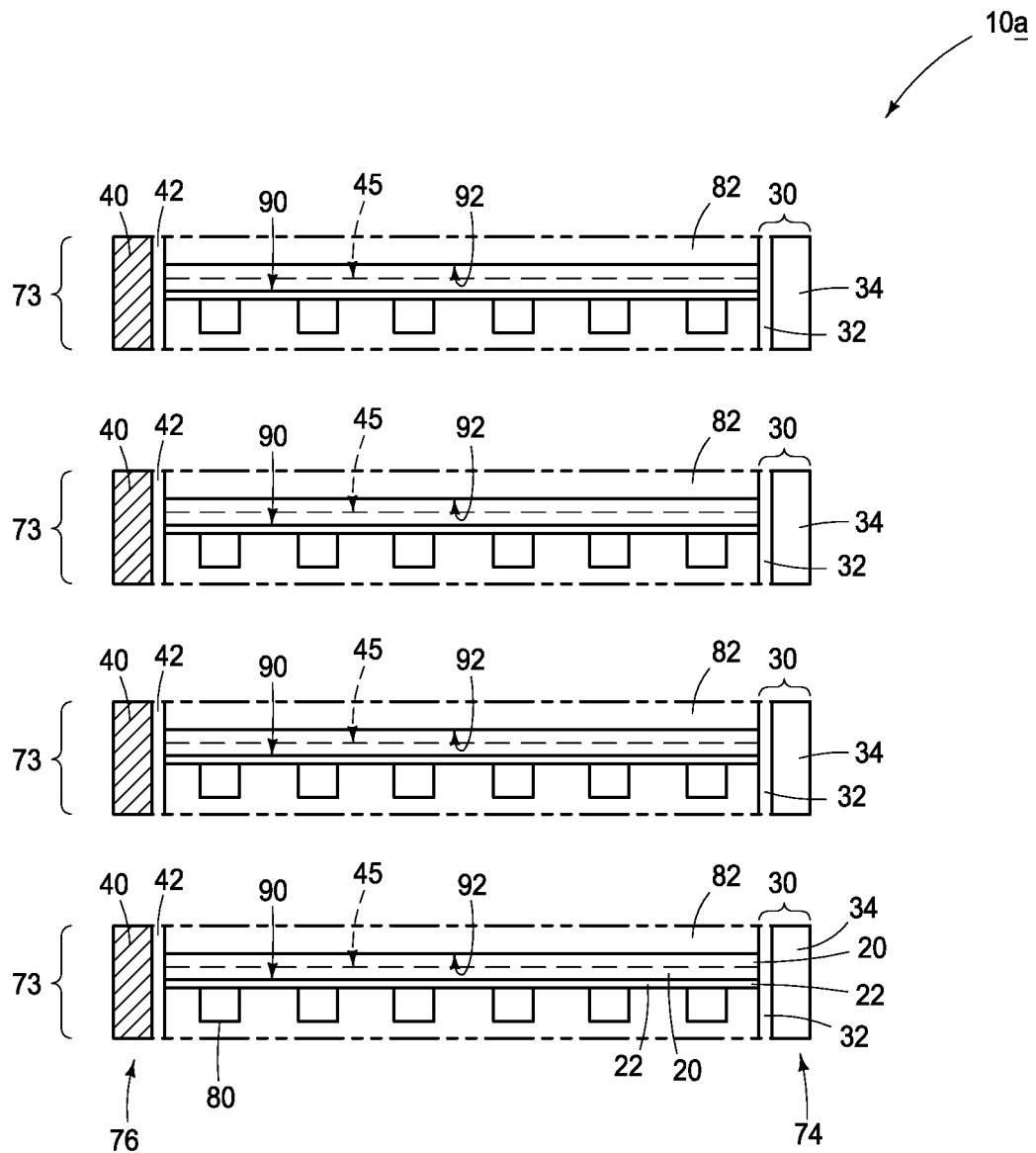

Referring to FIG. 21, thermal processing is utilized to cause metal 42 to migrate along the tiers 71-73 from end 76 to end 74 and thereby induce crystallization within the semiconductor channel material 20. Such crystallization forms grain boundaries within the semiconductor channel material parallel to the surfaces 90 and 92, as is diagrammatically illustrated with dashed lines 45.

Figure 22:
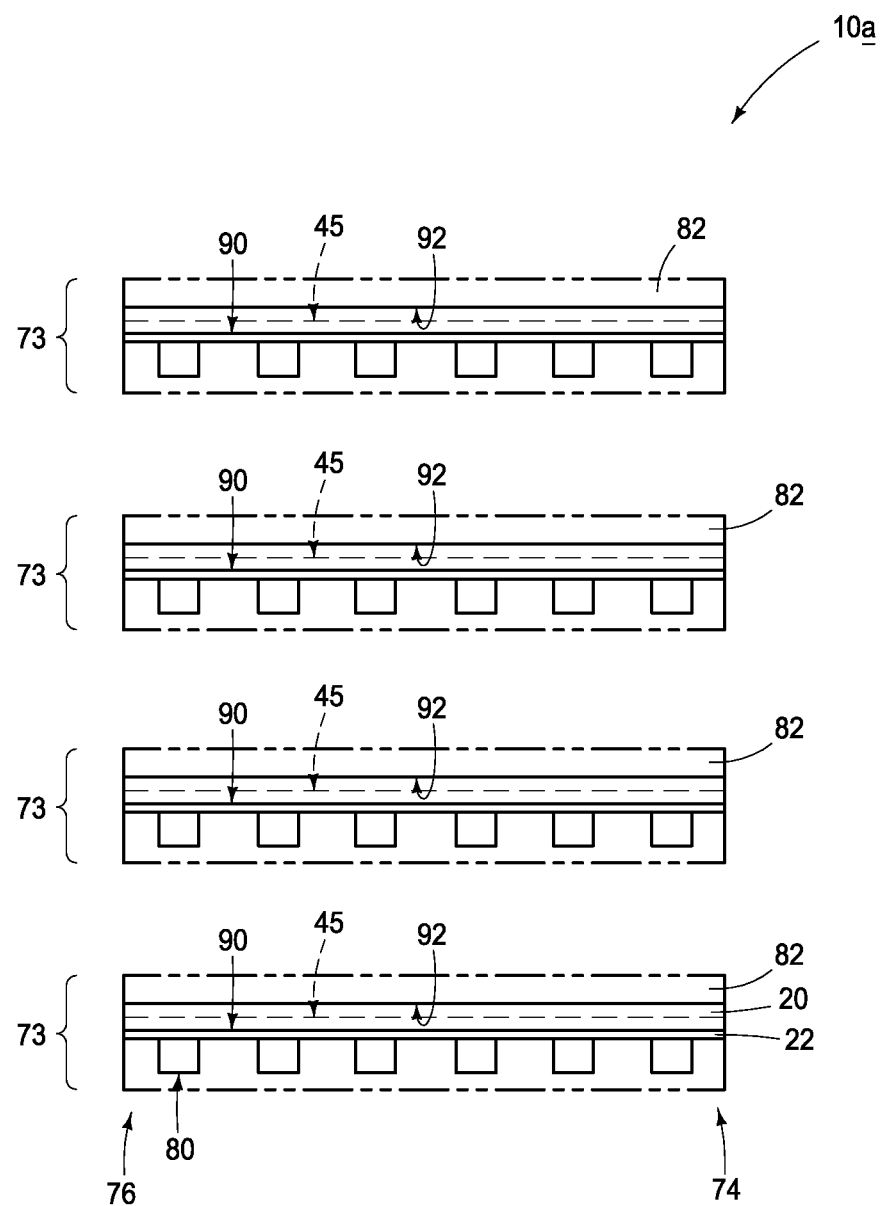

Referring to FIG. 22, the gettering material 30, filter material 40 and metal 42 are removed to leave a TFT-NAND flash memory configuration having semiconductor channel material 20 with grain boundaries parallel to the parallel surfaces 90 and 92 of the gate dielectric 22 and insulative material 82.

The TFT-NAND flash memory comprises a plurality of memory cells 100 (only a couple of which are labeled). The processing of FIGS. 19-22 may be performed analogously to that described above relative to the embodiments of FIGS. 2-18 such that the desired crystallographic orientation within semiconductor channel material 20 is achieved, and subsequently metal is entirely (or at least substantially entirely) removed from the semiconductor channel material so that the memory cells 100 have desired electrical characteristics. In some embodiments the metal concentration within the channel material 20 at the processing stage of FIG. 22 will be low or non-existent (for instance, less than or equal to about 0.5 atomic percent) throughout an entirety of the channel regions so that all of the memory cells of the NAND flash memory have Ion/Ioff characteristics within a same order of magnitude as would occur if the semiconductor channel material 20 had no metal therein; within a factor of five as would occur if the semiconductor material had no metal therein, or even with a factor of two as would occur if the semiconductor material had no metal therein.

In some embodiments a first portion of a TFT-NAND flash memory stack may be treated with the processing of FIGS. 19-22 prior to forming one or more additional portions over said first portion. Each of the additional portions may be subsequently treated with the processing of FIGS. 19-22. In some embodiments, TFT-NAND flash memory may be built one layer at a time, with individual layers being treated with the processing of FIGS. 19-22 prior to forming the next layer thereover.

The structures and configurations discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure having semiconductor material within a region between two parallel surfaces. The semiconductor material has grain boundaries parallel to the parallel surfaces. At least one circuit component utilizes a region of the semiconductor material in a gated device. The semiconductor material has little if any metal therein (for instance, less than or equal to about 0.5 atomic percent metal) so that the gated device has Ion/Ioff characteristics within a same order of magnitude as would occur if the semiconductor material had no metal therein.

Some embodiments include a method of forming an integrated structure. A configuration is provided which has semiconductor material between a pair of parallel surfaces. The semiconductor material has a first crystallographic texture. The parallel surfaces and semiconductor material extend between a first end and a second end. Metal is formed adjacent the first end. The metal comprises one or more metals selected from the group consisting of aluminum, near-noble metal and noble metal. A first region of gettering material is formed adjacent the second end, and a second region of gettering material is formed across the first region of gettering material. The semiconductor material and first and second regions of gettering material are thermally processed. The metal induces crystallization of the semiconductor material to transition the first crystallographic texture to a second crystallographic texture. The second crystallographic texture has grain boundaries parallel to the parallel surfaces. Thermodynamics drives the metal along the semiconductor material from the first end to the second end, then from the semiconductor material into the first gettering region, and then from the first gettering region to the second gettering region. The first and second gettering regions are subsequently removed.

Some embodiments include a method of forming an integrated structure. A configuration is provided which has semiconductor material between a pair of parallel surfaces. The configuration is a U-shaped NAND string with the parallel surfaces being U-shaped and on opposing sides of a channel region. The semiconductor material has a first crystallographic texture. The parallel surfaces and semiconductor material extend between a first end along one side of the U-shape and a second end along another side of the U-shape, Metal is formed adjacent the first end. The metal comprises one or more metals selected from the group consisting of aluminum, near-noble metal and noble metal. The semiconductor material is thermally processed with the metal therein. The metal induces crystallization of the semiconductor material to transition the first crystallographic texture to a second crystallographic texture. A first region of gettering material is formed across the first and second ends, and a second region of the gettering material is formed across the first region of the gettering material. The semiconductor material and first and second gettering regions of gettering material are thermally processed, and thermodynamics drives the metal from the semiconductor material into the first gettering region, and then from the first gettering region to the second gettering region. The first and second gettering regions are subsequently removed.

Some embodiments include a method of forming an integrated structure. A configuration is provided which has semiconductor material between a pair of parallel surfaces. The configuration is a U-shaped NAND string with the parallel surfaces being U-shaped and on opposing sides of a channel region. The semiconductor material has a first crystallographic texture. The parallel surfaces and semiconductor material extend between a first end along one side of the U-shape and a second end along another side of the U-shape. A first region of gettering material formed across the second end, and a second region of gettering material is formed across the first region of gettering material. The first and second regions of the gettering material are patterned to cover the second end while leaving the first end exposed. Metal-barrier material is formed over the second region of the gettering material. The metal-barrier material is patterned to cover the second region of the gettering material while leaving the first end exposed. Metal is formed over the metal-barrier material and adjacent the exposed first end. The metal comprises one or more metals selected from the group consisting of aluminum, near-noble metal and noble metal. The semiconductor material and first and second regions of gettering material are thermally processed. Thermodynamics drives the metal along the semiconductor material from the first end to the second end, then from the semiconductor material into the first gettering region, and then from the first gettering region to the second gettering region. The first and second gettering regions are subsequently removed.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure comprising:
    semiconductor material extending through dielectric material, the semiconductor material comprising a first end spaced from a second end;
    a metal over the first end of the semiconductor material, the metal comprising a composition of only metal; and
    a gettering material over the second end of the semiconductor material.

2. The integrated structure of claim 1 wherein the dielectric material comprises interior surfaces on opposing sides of the semiconductor material, the interior surfaces being in a parallel relationship to each other, the semiconductor material having grain boundaries parallel to the parallel interior surfaces.

3. The integrated structure of claim 1 further comprising at least one circuit component utilizing a region of the semiconductor material in a gated device.

4. The integrated structure of claim 1 wherein the semiconductor material comprises a channel structure and the dielectric material comprises a portion of a gated device.

5. The integrated structure of claim 4 wherein the gated device has Ion/Ioff characteristics within a factor of five as would occur if the semiconductor material had no metal therein.

6. The integrated structure of claim 4 wherein the gated device has Ion/Ioff characteristics within a factor of two as would occur if the semiconductor material had no metal therein.

7. The integrated structure of claim 1 wherein the semiconductor material is silicon.

8. A method of forming an integrated structure, comprising:
    providing a configuration having semiconductor material between a pair of parallel surfaces, the semiconductor material having a first crystallographic texture; the parallel surfaces and semiconductor material extending between a first end and a second end;
    forming metal adjacent the first end, the metal comprising one or more metals selected from the group consisting of aluminum, near-noble metal and noble metal;
    forming gettering material adjacent the second end; and
    thermal processing the semiconductor material and the gettering material, the thermodynamics driving the metal along the semiconductor material from the first end to the second end.

9. The method of claim 8 further comprising removing the gettering material.

10. The method of claim 9 wherein after removing the gettering material, the semiconductor material having little if any of the metal remaining therein.

11. The method of claim 8 wherein the configuration is a NAND string with the parallel surfaces being on opposing sides of the semiconductor material.

12. The method of claim 8 wherein the configuration is a U-shaped NAND string with the parallel surfaces being U-shaped and on opposing sides of the semiconductor material.

13. A method of forming an integrated structure, comprising:
    providing a configuration having semiconductor material between a pair of parallel surfaces, the configuration being a U-shaped NAND string with the parallel surfaces being U-shaped and on opposing sides of a channel region; the semiconductor material having a first crystallographic texture; the parallel surfaces and semiconductor material extending between a first end along one side of the U-shape and a second end along another side of the U-shape;

forming metal adjacent the first end, the metal comprising one or more metals selected from the group consisting of aluminum, near-noble metal and noble metal; and thermal processing the semiconductor material with the metal therein, the metal inducing crystallization of the semiconductor material to transition the first crystallographic texture to a second crystallographic texture.

14. The method of claim 13 further comprising:

forming a first region of gettering material across the first and second ends;

forming a second region of the gettering material across the first region of the gettering material; and thermal processing the first and second regions of the gettering material; the thermodynamics driving the metal from the semiconductor material into the first gettering region.

15. The method of claim 14 wherein the thermal processing of the first and second regions of the gettering material further drives the metal from the first gettering region to the second gettering region.

16. The method of claim 14 wherein the first and second regions of gettering material are comprised by two or more distinct layers.

17. The method of claim 14 wherein the first region of the gettering material has a higher amorphous-to-crystal transition temperature than the semiconductor channel material and the second region of the gettering material.

18. A method of forming an integrated structure, comprising:

providing a configuration having semiconductor material between a pair of parallel surfaces, the configuration being a U-shaped NAND string with the parallel surfaces being U-shaped and on opposing sides of a channel region; the semiconductor material having a first crystallographic texture; the parallel surfaces and semiconductor material extending between a first end along one side of the U-shape and a second end along another side of the U-shape;

forming a first region of gettering material across the second end, and forming a second region of the gettering material across the first region of the gettering material; the first and second regions of the gettering material being patterned to cover the second end while leaving the first end exposed;

forming metal-barrier material over the second region of the gettering material; the metal-barrier material being patterned to cover the second region of the gettering material while leaving the first end exposed; and thermal processing the semiconductor material and the first and second regions of the gettering material; thermodynamics driving the metal along the semiconductor material from the first end to the second end.

19. The method of claim 18 wherein the metal-barrier material comprises silicon nitride.

20. The method of claim 18 wherein the first and second regions of gettering material are comprised by a structure having a first stoichiometry in the first gettering region, a second stoichiometry in the second gettering region, and a gradient from the first gettering region to the second gettering region; the first stoichiometry transitioning to the second stoichiometry along said gradient.

21. The method of claim 20 wherein the first stoichiometry includes $M_aSi_x$ and the second stoichiometry includes $M_bSi_y$, wherein the ratio of a/x is greater than the ratio of b/y, and wherein M is tungsten or tantalum.

22. An integrated structure comprising:

semiconductor material extending through dielectric material, the semiconductor material comprising a first end spaced from a second end;

a metal over the first end of the semiconductor material;

a gettering material over the second end of the semiconductor material; and wherein the dielectric material comprises interior surfaces on opposing sides of the semiconductor material, the interior surfaces being in a parallel relationship to each other, the semiconductor material having grain boundaries parallel to the parallel interior surfaces.

23. An integrated structure comprising:

semiconductor material extending through dielectric material, the semiconductor material comprising a first end spaced from a second end;

a metal over the first end of the semiconductor material;

a gettering material over the second end of the semiconductor material;

wherein the semiconductor material comprises a channel structure and the dielectric material comprises a portion of a gated device; and wherein the gated device has Ion/Ioff characteristics within a factor of five as would occur if the semiconductor material had no metal therein.

24. An integrated structure comprising:

semiconductor material extending through dielectric material, the semiconductor material comprising a first end spaced from a second end;

a metal over the first end of the semiconductor material;

a gettering material over the second end of the semiconductor material;

wherein the semiconductor material comprises a channel structure and the dielectric material comprises a portion of a gated device; and wherein the gated device has Ion/Ioff characteristics within a factor of two as would occur if the semiconductor material had no metal therein.

* * * * *